(12) United States Patent
Lee et al.

(10) Patent No.: US 7,733,456 B2
(45) Date of Patent: Jun. 8, 2010

(54) LIQUID CRYSTAL DISPLAY DEVICE HAVING CONTACT STRUCTURE AND METHOD OF FABRICATING THE SAME

(75) Inventors: Kyoung Mook Lee, Seoul (KR); Seung Hee Nam, Kyounggi-do (KR); Jae Young Oh, Kyounggi-do (KR)

(73) Assignee: LG Display Co., Ltd., Seoul (KR)

( * ) Notice: Subject to any disclaimer, the term of this patent is extended or adjusted under 35 U.S.C. 154(b) by 21 days.

(21) Appl. No.: 10/833,288

(22) Filed: Apr. 28, 2004

(65) Prior Publication Data

US 2004/0257509 A1 Dec. 23, 2004

(30) Foreign Application Priority Data

Jun. 20, 2003 (KR) .................. 10-2003-0040126

(51) Int. Cl.
G02F 1/1345 (2006.01)
G02F 1/1343 (2006.01)

(52) U.S. Cl. .................. 349/152; 349/138; 349/140; 349/141; 349/149

(58) Field of Classification Search .................. 349/43, 349/139, 152
See application file for complete search history.

(56) References Cited

U.S. PATENT DOCUMENTS

| | | | |
|---|---|---|---|
| 5,731,856 A * | 3/1998 | Kim et al. ............... 349/43 |
| 6,172,733 B1 | 1/2001 | Hong et al. ............. 349/152 |
| 6,184,966 B1 * | 2/2001 | Fujita et al. ............ 349/152 |
| 6,190,934 B1 | 2/2001 | Kang et al. ............. 438/30 |
| 6,297,519 B1 * | 10/2001 | Fujikawa et al. ........ 257/59 |
| 6,366,331 B1 | 4/2002 | Sakamoto et al. ....... 349/43 |
| 6,388,725 B2 * | 5/2002 | Ohta et al. .............. 349/139 |
| 6,396,558 B1 | 5/2002 | Kim et al. ............... 349/152 |
| 6,630,688 B2 * | 10/2003 | Kong et al. ............. 257/72 |
| 6,961,110 B2 * | 11/2005 | Ogawa et al. ........... 349/150 |
| 2001/0052951 A1 * | 12/2001 | Ashizawa et al. ....... 349/43 |
| 2002/0067452 A1 * | 6/2002 | Sakamoto et al. ....... 349/139 |
| 2002/0115263 A1 | 8/2002 | Worth et al. |
| 2003/0036221 A1 | 2/2003 | Song et al. ............. 438/141 |
| 2003/0058396 A1 * | 3/2003 | Shih ..................... 349/141 |
| 2003/0102424 A1 | 6/2003 | Izumi et al. ............ 250/208.1 |
| 2003/0123009 A1 * | 7/2003 | Jo et al. ................. 349/141 |
| 2003/0164919 A1 | 9/2003 | Oh et al. |
| 2004/0041958 A1 * | 3/2004 | Hwang et al. .......... 349/43 |
| 2004/0070718 A1 * | 4/2004 | Saigo et al. ............ 349/141 |

FOREIGN PATENT DOCUMENTS

FR 2 775 386 8/1999

(Continued)

*Primary Examiner*—Andrew Schechter
(74) *Attorney, Agent, or Firm*—Morgan Lewis & Bockius LLP

(57) ABSTRACT

A liquid crystal display device includes a plurality of signal lines on a substrate, a plurality of pad electrodes on the substrate, each one of the plurality of pad electrodes connected to one of the plurality of signal lines, at least one insulating film on the plurality of pad electrodes, the at least one insulating film having a plurality of contact holes to expose portions of the pad electrodes, and a conductive film electrically connected to each of the plurality of pad electrodes through the contact holes.

10 Claims, 41 Drawing Sheets

FOREIGN PATENT DOCUMENTS

| | | |
|---|---|---|
| JP | 07-169967 | 7/1995 |
| JP | 07-230100 | 8/1995 |
| JP | 10-48654 | 2/1998 |
| JP | 10-232409 | 9/1998 |
| JP | 10-282528 | 10/1998 |
| JP | 2003-098975 | 4/2003 |
| JP | 2003-131253 | 5/2003 |

* cited by examiner

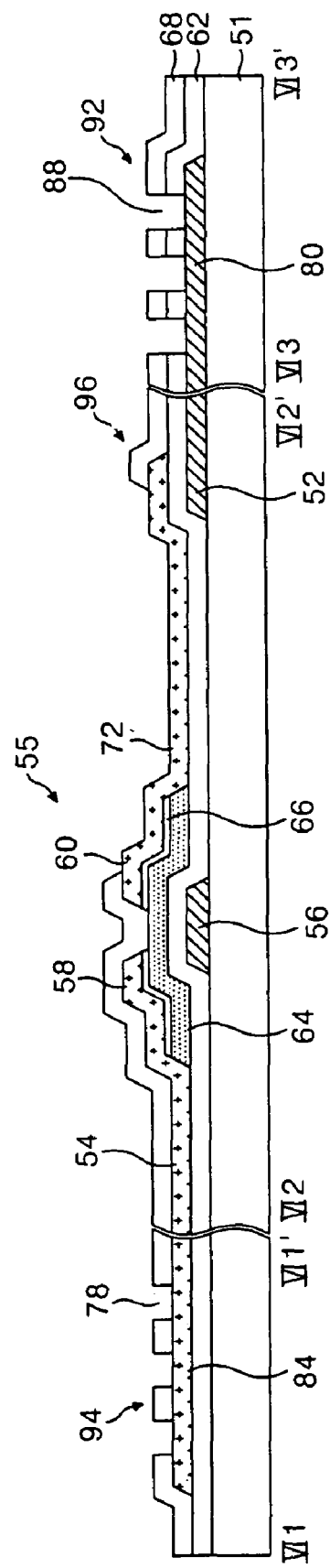

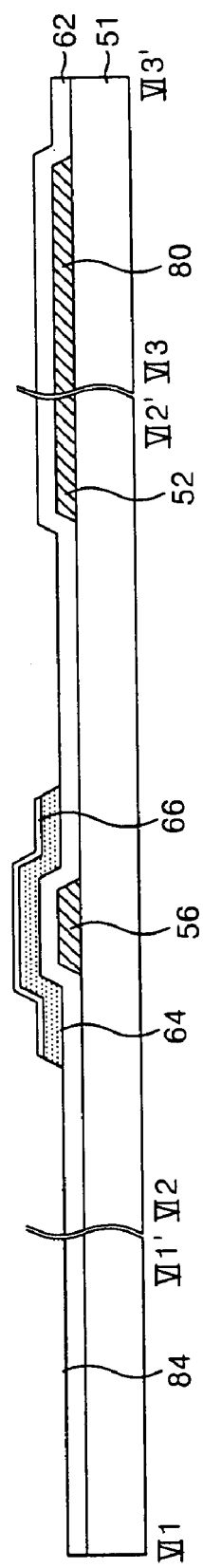

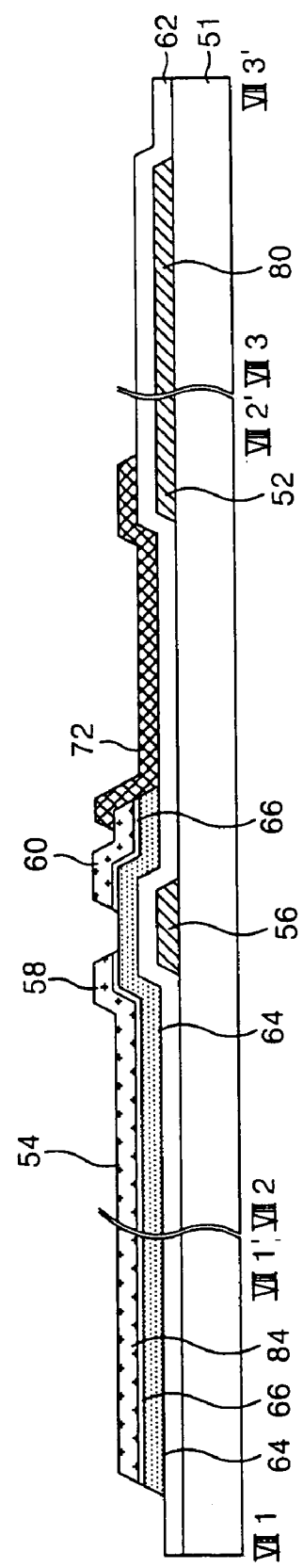

LIQUID CRYSTAL DISPLAY DEVICE HAVING CONTACT STRUCTURE AND METHOD OF FABRICATING THE SAME

The present invention claims the benefit of Korean Patent Application No. P2003-40126 filed in Korea on Jun. 20, 2003, which is hereby incorporated by reference.

BACKGROUND OF THE INVENTION

1. Field of the Invention

The present invention relates to a display device and method of fabricating a display device, and more particularly, to a liquid crystal display device and a method of fabricating a liquid crystal display device.

2. Description of the Related Art

In general, liquid crystal display (LCD) devices control light transmittance of liquid crystal cells arranged in a matrix configuration in response to video signals to display images corresponding to the video signals on liquid crystal display panels. The LCD device includes a liquid crystal display panel having liquid crystal cells arranged in an active matrix array, and driving integrated circuits (ICs) for driving the liquid crystal cells. The driving ICs are mounted on a tape carrier package (TCP) when they are manufacture by a tape automated bonding (TAB) system. Conversely, the driving ICs are mounted on a surface of the liquid crystal panel when they are manufactured by a chip-on-glass (COG) system. In the TAB system, the driving ICs are electrically connected to a pad portion provided in the liquid crystal panel by means of the TCP.

FIG. 1 is a plan view of a liquid crystal display device according to the related art, and FIG. 2 is a cross sectional view along II-II' of FIG. 1 according to the related art. In FIG. 1, the LCD device includes an image display section 40, and a gate pad 42 and a data pad 44 connected between the driving ICs and the image display section 40. The image display section 40 has a structure in which a thin film transistor array substrate 48 and a color array substrate are attached to each other and has liquid cells arranged therein.

Within the image display section 40, the thin film transistor array substrate 48 includes data lines to which data signals are provided, gate lines to which gate signals are provided, a thin film transistor to switch the liquid crystal cells located at the intersection of data and gate lines, a pixel electrode connected to the thin film transistor to drive the liquid crystal cell, and a lower alignment film applied thereon to provide an alignment of liquid crystal materials.

The color filter array substrate 46 includes a color filter for producing colored light, a black matrix for prohibiting light leakage, a common electrode for producing a vertical electric field along with the pixel electrode, and an upper alignment film applied thereon for providing an alignment of liquid crystal materials.

The thin film transistor array substrate 48 and the color filter array substrate 46 are spaced from each other by a spacer in order to provide a uniform cell gap. In addition, liquid crystal material is filled into the cell gap provided by the spacer.

In FIG. 1, the gate pad 42 supplies gate signals from the gate driving IC to each gate line of the image display section 40. As shown in FIG. 2, the gate pad 42 includes a gate pad lower electrode 30 extending from the gate line and a gate pad upper electrode 32 connected to the gate pad lower electrode 30 via a gate contact hole 38 passing through a gate insulating film 12 and a passivation film 18.

In FIG. 1, the data pad 44 supplies data signals from the data driving IC to each data line of the image display section 40. As shown in FIG. 2, the data pad 44 includes a data pad lower electrode 34 extending from the data line and a data pad upper electrode 36 connected to the data pad lower electrode 34 via a data contact hole 28 passing through the passivation film 18.

Although not shown, the gate pad 42 and the data pad 44 are in contact with TCPs having the driving ICs mounted thereon in the TAB system. For example, the gate pad lower electrode 30 connected to the gate line is electrically connected to the gate TCP having the gate driving ICs mounted thereon via the gate pad upper electrode 32. Similarly, the data pad lower electrode 34 connected to the data line is electrically connected to the data TCP having the data driving ICs mounted thereon via the data pad upper electrode 36. Accordingly, the gate pad upper electrode 32 and the data pad upper electrode 36 serve to prevent the gate pad lower electrode 30 and the data pad lower electrode 34, respectively, from being damaged during repeated steps of contacting the TCPs that are required for the TAB system.

LCD devices (e.g., reflective-type LCD devices or In-Plane Switching-type LCD devices) do not require transparent conductive films. Similarly, transmissive-type LCD devices do not require transparent conductive films within the gate pad 42 and the data pad 44 in order to reduce a total number of mask processes and to lower manufacturing costs. Accordingly, these LCD devices have gate pads 42 and data pads 44, as shown in FIGS. 1 and 2.

FIG. 3A is a plan view of a pad structure according to the related art, and FIG. 3B is a cross sectional view along III1-III1' of FIG. 3A according to the related art. Similarly, FIG. 3C is a plan view of another pad structure according to the related art, and FIG. 3D is a cross sectional view along III2-III2' of FIG. 3C according to the related art. In FIGS. 3B and 3D, the gate pad lower electrode 30 and the data pad lower electrode 34 included in the gate pad 42 and the data pad 44, respectively, are entirely exposed.

FIG. 4A is a plan view of another pad structure according to the related art, and FIG. 4B is a cross sectional view along IV1-IV1' of FIG. 4A according to the related art. Similarly, FIG. 4C is a plan view of another pad structure according to the related art, and FIG. 4D is a cross sectional view along IV2-IV2' of FIG. 4C according to the related art. In FIGS. 4B and 4D, the gate pad lower electrode 30 and the data pad lower electrode 34 are partially exposed through a gate contact hole 28 and a data contact hole 38, as suggested in Japanese Laid-Open Patent Heisei 1-287624.

In the pad structures of FIGS. 3A-3D and 4A-4D the gate pad lower electrode 30 and the data pad lower electrode 34 are either completely or partially exposed to directly contact with the TCP having driving ICs mounted thereon in the TAB system. However, if a defect occurs due to misalignment caused when the TCP is bonded to the gate pad lower electrode 30 and the data pad lower electrode 34, repairing processes of attaching and detaching the TCP should be repeatedly performed several times. During the repairing processes, the exposed gate pad lower electrode 30 and the exposed data pad lower electrode 34 are both damaged by being pulled out together with the TCP. Accordingly, this damage causes electrical disconnection in both the gate pad lower electrode 30 and the data pad lower electrode 34.

SUMMARY OF THE INVENTION

Accordingly, the present invention is directed to a liquid crystal display device and a method of fabricating a liquid crystal display device that substantially obviates one or more of the problems due to limitations and disadvantages of the related art.

An object of the present invention to provide a liquid crystal display device capable of undergoing a TAB repairing process.

Another object of the present invention is to provide a method of fabricating a liquid crystal display device capable of undergoing a TAB repairing process.

Additional features and advantages of the invention will be set forth in the description which follows, and in part will be apparent from the description, or may be learned by practice of the invention. The objective and other advantages of the invention will be realized and attained by the structure particularly pointed out in the written description and claims hereof as well as the appended drawings.

To achieve these and other advantages and in accordance with the purpose of the present invention, as embodied and broadly described, A liquid crystal display device includes a plurality of signal lines on a substrate, a plurality of pad electrodes on the substrate, each one of the plurality of pad electrodes connected to one of the plurality of signal lines, at least one insulating film on the plurality of pad electrodes, the at least one insulating film having a plurality of contact holes to expose portions of the pad electrodes, and a conductive film electrically connected to each of the plurality of pad electrodes through the contact holes.

In another aspect, a method of fabricating a liquid crystal display device includes forming a plurality of pad electrodes connected to a plurality of signal lines on a substrate, forming at least one insulating film having a plurality of contact holes to expose portions of the plurality of pad electrodes, and connecting the exposed portions of the pad electrodes directly with a conductive film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention are incorporated in and constitute a part of this specification, illustrate embodiments of the invention and together with the description serve to explain the principles of the invention. In the drawings:

FIG. 6 is a cross sectional view along VI1-VI1', VI2-VI2' and VI3-VI3' of FIG. 5 according to the present invention;

FIGS. 7A to 7D are cross sectional views along VI1-VI1', VI2-VI2' and VI3-VI3' of an exemplary method of fabricating the thin film transistor array substrate of FIG. 6 according to the present invention;

FIGS. 9A to 9D are cross sectional views along VI1-VI1', VI2-VI2' and VI3-VI3' of FIG. 8 of an exemplary method of fabricating the thin film transistor array substrate of FIG. 8 according to the present invention;

DETAILED DESCRIPTION OF THE PREFERRED EMBODIMENTS

Reference will now be made in detail to the preferred embodiments of the present invention, examples of which are illustrated in the accompanying drawings.

Figure 1:
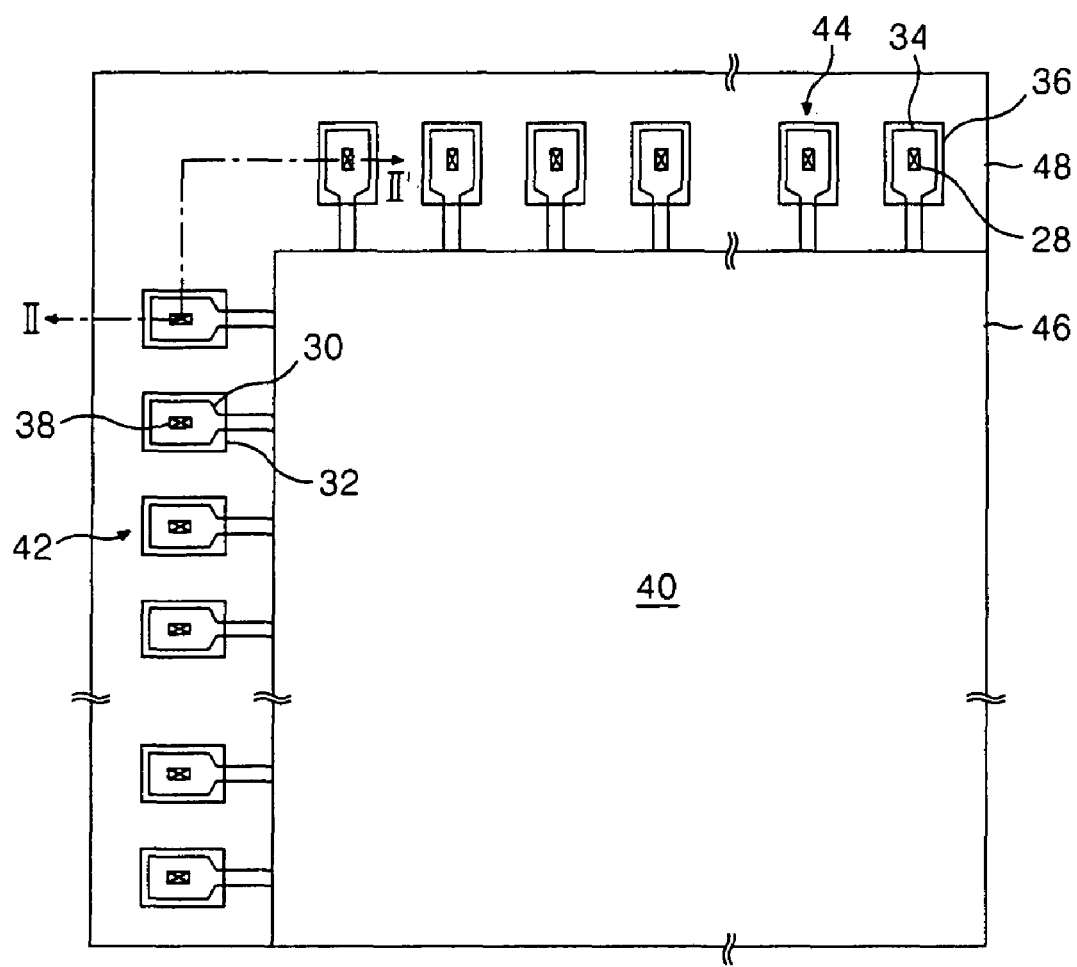
FIG. 1 is a plan view of a liquid crystal display device according to the related art.
Figure 2:
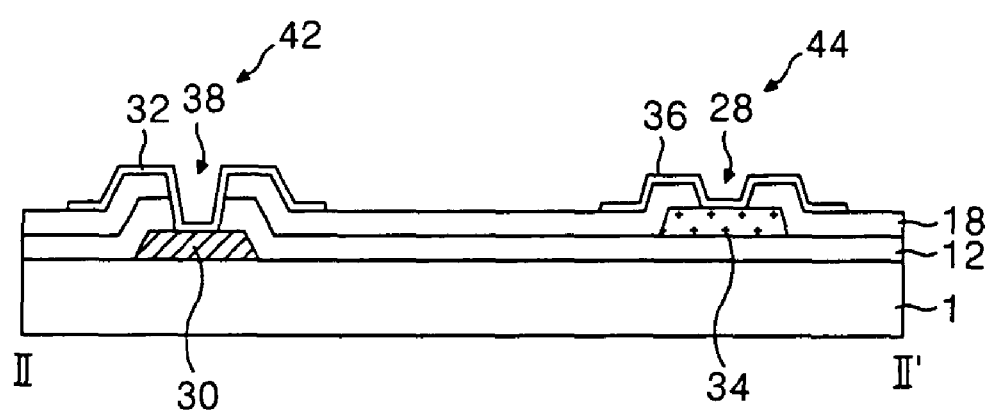
FIG. 2 is a cross sectional view along II-II' of FIG. 1 according to the related art.
Figure 3A:
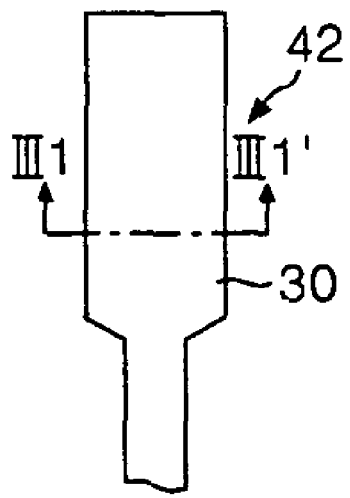
FIG. 3A is a plan view of a pad structure according to the related art.
Figure 3B:
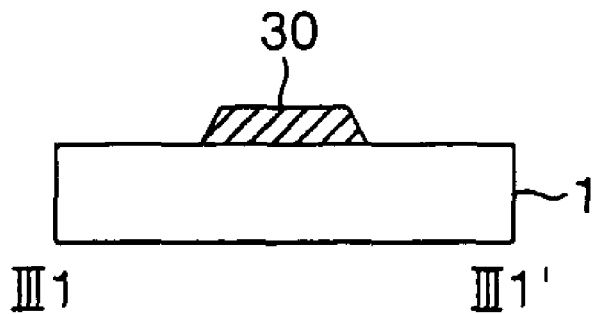
FIG. 3B is a cross sectional view along III1-III1' of FIG. 3A according to the related art.
Figure 3C:
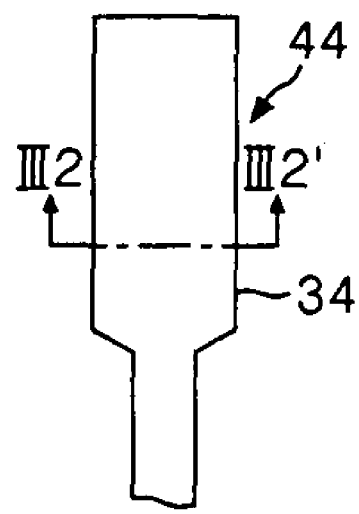
FIG. 3C is a plan view of another pad structure according to the related art.
Figure 3D:
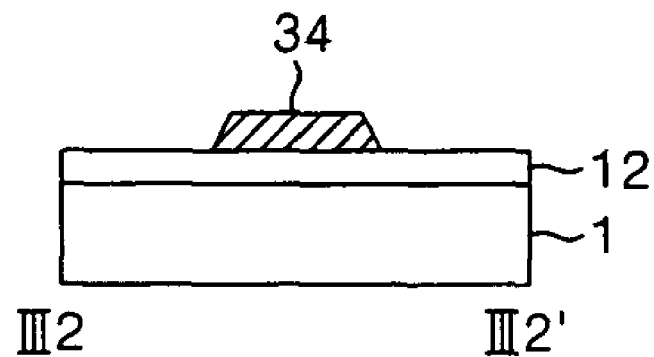
FIG. 3D is a cross sectional view along III2-III2' of FIG. 3C according to the related art.
Figure 4A:
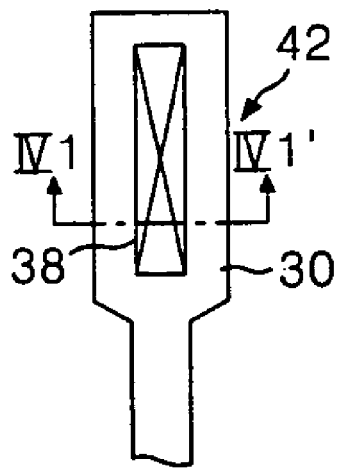
FIG. 4A is a plan view of another pad structure according to the related art.
Figure 4B:
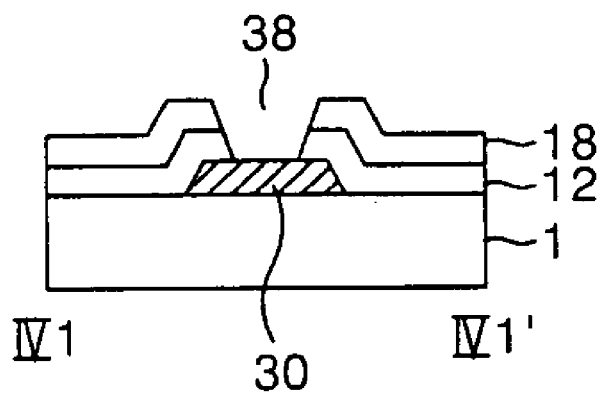
FIG. 4B is a cross sectional view along IV1-IV1' of FIG. 4A according to the related art.
Figure 4C:
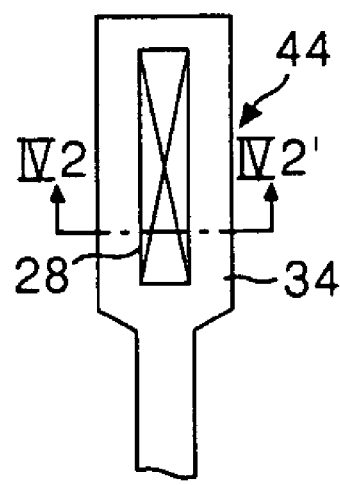
FIG. 4C is a plan view of another pad structure according to the related art.
Figure 4D:
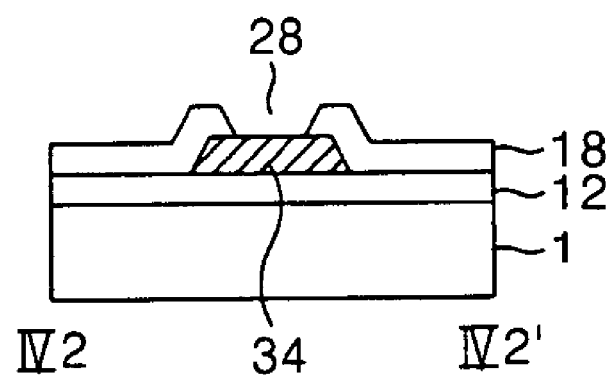
FIG. 4D is a cross sectional view along IV2-IV2' of FIG. 4C according to the related art.
Figure 5:
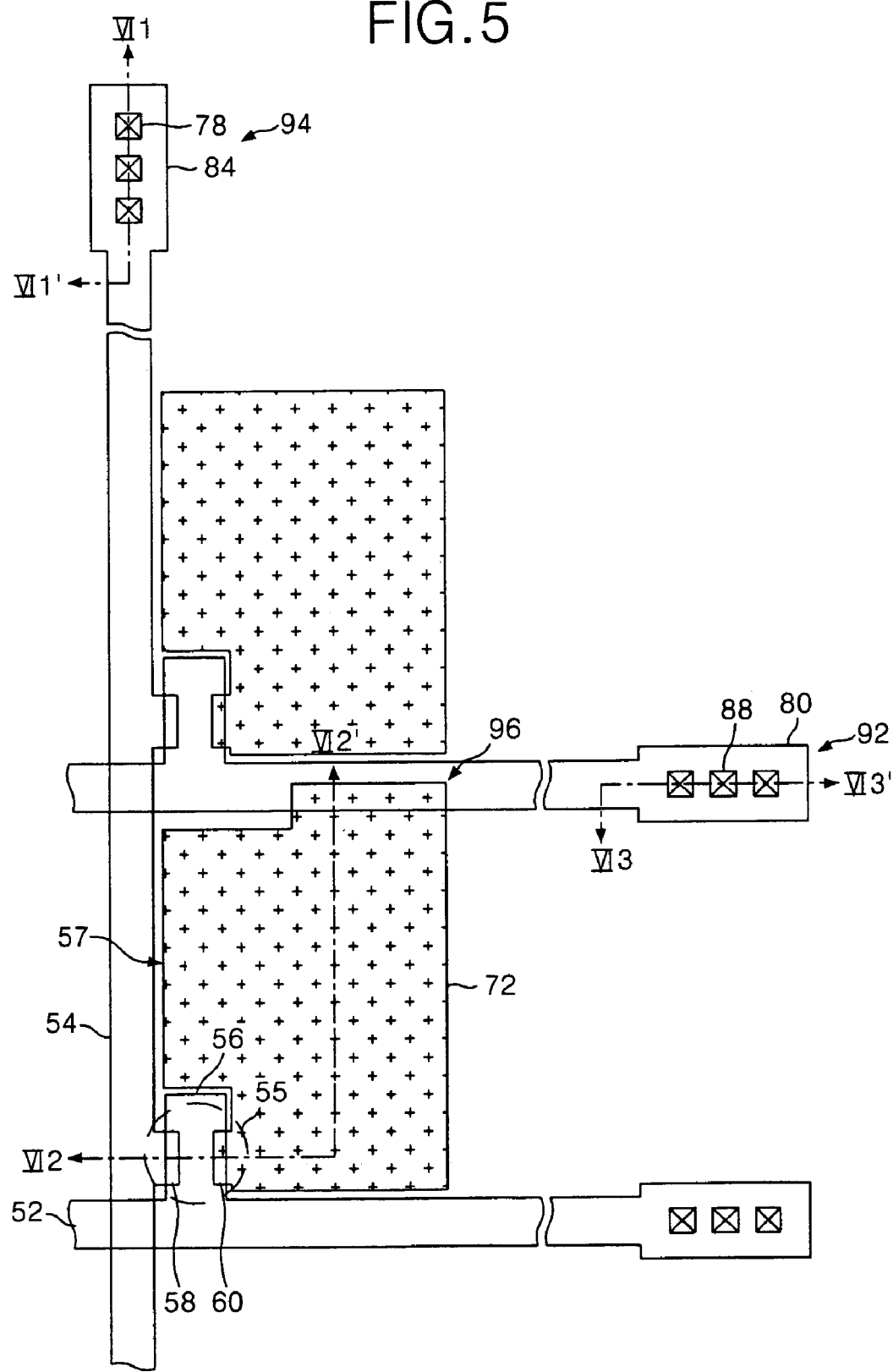
FIG. 5 is a plan view of an exemplary thin film transistor array substrate according to the present invention.

FIG. 5 is a plan view of an exemplary thin film transistor array substrate according to the present invention, and FIG. 6 is a cross sectional view along VI1-VI1', VI2-VI2' and VI3-VI3' of FIG. 5 according to the present invention. In FIGS. 5 and 6, a thin film transistor array substrate may include a gate line 52 and a data line 54 provided on a lower substrate 51 to intersect each other with a gate insulating film 62 disposed therebetween. In addition, a thin film transistor 55 may be provided at each intersection of the gate and data lines 52 and 54, a reflective electrode 72 may be formed at a pixel area 57 arranged at the intersection of the gate and data lines 52 and 54, a storage capacitor 96 may be formed in an overlapped area of the gate line 52 and the reflective electrode 72, a gate pad 92 may be connected to the gate line 52, and a data pad 94 may be connected to the data line 54. Accordingly, the gate line 52 may supply gate signals from the gate pad 92 and the data line 54 may supply data signals from the data pad 94.

The thin film transistor 55, in response to the gate signals transmitted along the gate line 52, may allow a pixel signal transmitted along the data line 54 to be charged in the reflective electrode 72. The thin film transistor 55 may include a gate electrode 56 connected to the gate line 52, a source electrode 58 connected to the data line 54, and a drain electrode 60 connected to the reflective electrode 72. In addition, the thin film transistor 55 may include an active layer 64 overlapping the gate electrode 56 with a gate insulating film 62 therebetween, thereby defining a channel between the source electrode 58 and the drain electrode 60. Moreover, an ohmic contact layer 66 for making ohmic contact to the source electrode 58 and the drain electrode 60 may be provided on the active layer 64.

In FIG. 6, the reflective electrode 72 may be integral to the drain electrode 60 of the thin film transistor 55 and may be formed at the pixel region 57. Accordingly, an electric field may be formed between the reflective electrode 72 to which the pixel signal is supplied via the thin film transistor 55 and a common electrode (not shown) to which a reference voltage is supplied. The electric field may rotate liquid crystal molecules arranged between the thin film transistor array substrate and a color filter array substrate due to dielectric anisotropy. Accordingly, a light reflection ratio reflecting from the pixel region 57 may differ in accordance with a rotation amount of the liquid crystal molecules, thereby displaying images.

In FIGS. 5 and 6, the storage capacitor 96 may include a gate line 52 and a reflective electrode 72 overlapping the gate line 52 with the gate insulating film 62 disposed therebetween. The storage capacitor 96 may stably maintain a pixel signal charged in the reflective electrode 72 until a next pixel signal is charged to the reflective electrode 72.

Although not shown, the gate pad 92 may be connected to a gate driving IC to supply gate signals from the gate driving IC to the gate line 52. Accordingly, the gate pad 92 may include a gate pad electrode 80 extending from the gate line 52 and a plurality of gate contact holes 88 may pass through the gate insulating film 62 and a passivation film 68 to expose portions of the gate pad electrode 80. Thus, although a portion of the gate pad electrode 80 exposed through at least one or more of the gate contact holes 88 may be pulled out during repairing processes, the gate pad electrode 80 exposed through a remaining gate contact hole 88 may maintain electrical connection to the gate TCP having the gate driving IC mounted thereon. Accordingly, the gate signals from the gate driving IC may be supplied to the gate line 52 via the gate pad electrode 80.

Although not shown, the data pad 94 may be connected to a data driving IC to supply data signals from the data driving IC to the data line 54. Accordingly, the data pad 94 may include a data pad electrode 84 extending from the data line 54 and a plurality of data contact holes 78 passing through the passivation film 68 to expose portions of the data pad electrode 84. Thus, although a portion of the data pad electrode 84 exposed through at least one or more gate contact holes 78 may be pulled out during repairing processes, the data pad electrode 84 exposed through a remaining data contact hole 78 may maintain electrical connection to the data TCP having the data driving IC mounted thereon. Accordingly, the data signals from the data driving IC may be supplied to the data line 54 via the data pad electrode 84.

Figure 7A:
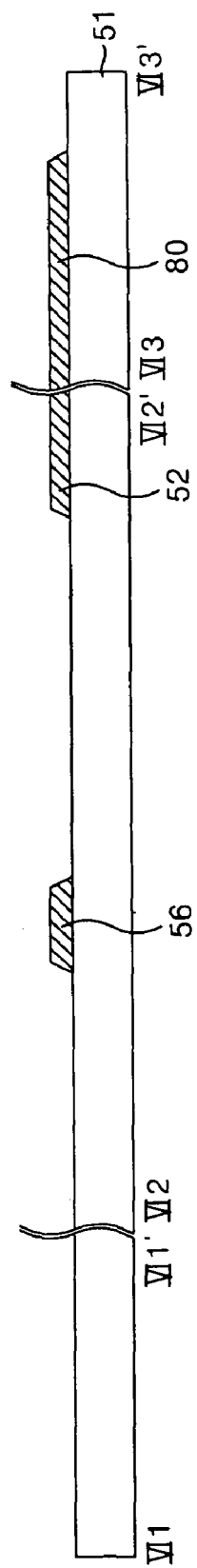

FIGS. 7A to 7D are cross sectional views along VI1-VI1', VI2-VI2' and VI3-VI3' of an exemplary method of fabricating the thin film transistor array substrate of FIG. 6 according to the present invention. In FIG. 7A, a first conductive pattern group including the gate line 52, the gate electrode 56, and the gate pad electrode 80 may be formed on the lower substrate 51. For example, a gate metal layer, such as an aluminum (Al) system metal or copper (Cu), may be formed on the lower substrate 51 by a deposition technique, such as sputtering. Then, the gate metal layer may be patterned by photolithographic and etching processes to form the first conductive pattern group including the gate line 52, the gate electrode 56, and the gate pad electrode 80.

In FIG. 7B, a semiconductor pattern including a gate insulating film 62, and an active layer 64 and an ohmic contact layer 66 on the gate insulating film 62 may be formed on the lower substrate 51 provided with the first conductive pattern group. For example, the gate insulating film 62 and first and second semiconductor layers may be sequentially formed on the lower substrate 51 by a deposition technique, such as plasma enhanced chemical vapor deposition (PECVD) and sputtering. The gate insulating film 62 may be made of an inorganic insulating material, such as silicon oxide ($SiO_x$) or silicon nitride ($SiN_x$). The first semiconductor layer may be made of undoped amorphous silicon, and the second conductor layer may be made of amorphous silicon doped with an impurity of a N-type or P-type. Then, the first and the second semiconductor layers may be simultaneously patterned by photolithographic and etching processes to form the semiconductor pattern including the active layer 64 and the ohmic contact layer 66.

Figure 7C:
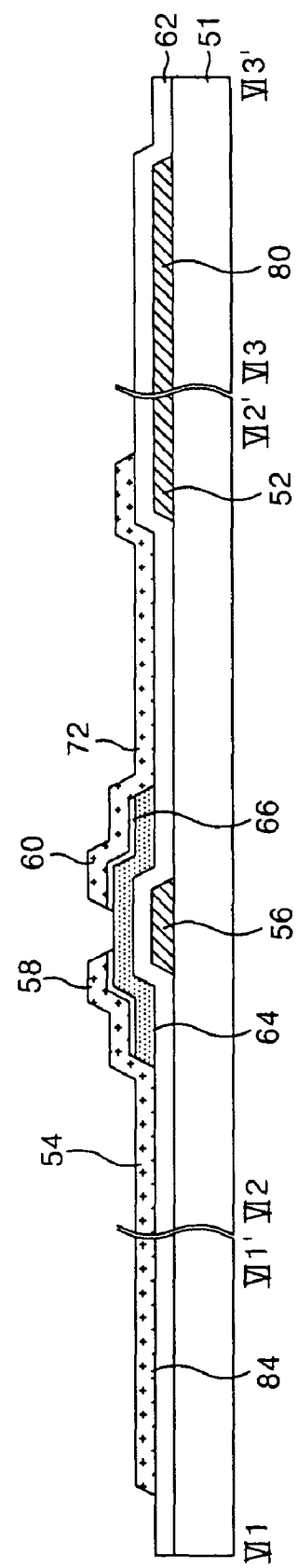

In FIG. 7C, a second conductive pattern group may be formed on the lower substrate 51 provided with the semiconductor pattern, wherein the second conductive pattern group may include a source electrode 58, a drain electrode 60, a reflective electrode 72, a data line 54, and a data pad electrode 84. For example, a data metal layer may be deposited on the lower substrate 51 having the semiconductor pattern. Then, the data metal layer may be patterned by photolithographic etching processes to form the second conductive pattern group including the data line 54, the source electrode 58, a drain electrode 60, a reflective electrode 72, which may be integral to the drain electrode 60, and a data pad electrode 84. In addition, the ohmic contact layer 66 may be etched by a dry etching process using the source electrode 58 and the drain electrode 60 as a mask, thereby exposing the active layer 64.

Figure 7D:
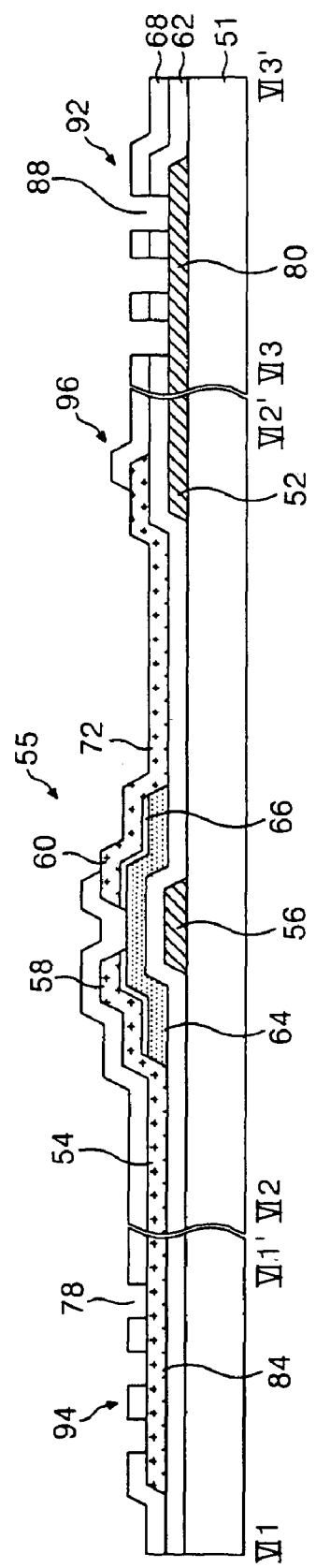

In FIG. 7D, a passivation film 68 including a plurality of gate contact holes 88 and data contact holes 78 may be formed on the lower substrate 51 provided with the second conductive pattern group. For example, the passivation film 68 may be formed on an entire surface of the gate insulating film 62 by a deposition method, such as PECVD. Then, the passivation film 68 may be patterned by photolithographic and etching processes to form the gate contact holes 88 and the data holes 78. The gate contact holes 88 may be formed to pass through the passivation film 68 and the gate insulating film 62 to expose regions of the gate pad electrode 80. Similarly, the data contact holes 78 may be formed to pass through the passivation film 68 to expose regions of the data pad electrode 80. The passivation film 68 may be made of an inorganic insulating material such as the gate insulating film 62 or an organic insulating material having a low dielectric constant, such as an acryl system organic compound, benzocyclobutene (BCB), or perfluorocyclobutane (PFCB).

Figure 8:
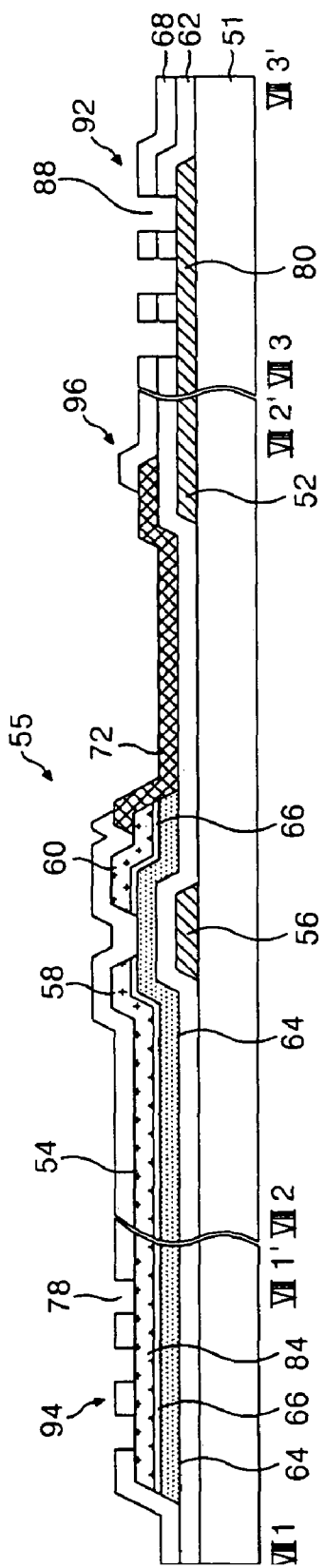
FIG. 8 is a cross sectional view along VI1-VI1', VI2-VI2' and VI3-VI3' of FIG. 5 according to another exemplary thin film transistor array substrate according to the present invention.

FIG. 8 is a cross sectional view along VI1-VI1', VI2-VI2' and VI3-VI3' of FIG. 5 according to another exemplary thin film transistor array substrate according to the present invention. In FIG. 8, a thin film transistor array substrate may be similar to the thin film transistor array substrate of FIGS. 5 and 6, except that the semiconductor pattern including the active layer and the ohmic contact layer may be formed below the second conductive pattern group including the source electrode, the drain electrode, the data pad electrode, and the data line along the second conductive pattern group. Accordingly, certain features of the exemplary thin film transistor array substrate of FIG. 8 have been omitted for the sake of brevity.

In FIG. 8, the source electrode 58, the drain electrode 60, and the data pad electrode 84 may be formed to have a pattern similar to the semiconductor pattern. In addition, the reflective electrode 72 may be made of a metal different from the drain electrode 60, and may be formed at the pixel region arranged by the data line 54 and the gate line 52.

Although not shown, the gate pad 92 may be connected to a gate driving IC to supply gate signals from the gate driving IC to a gate line 52. Accordingly, the gate pad 92 may include a gate pad electrode 80 extending from the gate line 52 and a plurality of gate contact holes 88 passing through the gate insulating film 62 and the passivation film 68 to expose portions of the gate pad electrode 80. Thus, although a portion of the gate pad electrode 80 exposed through at least one or more gate contact holes 88 may be pulled out during repairing processes, the gate pad electrode 80 exposed through a remaining gate contact hole 88 may maintain electrical connection to the gate TCP having the gate driving IC mounted thereon. Accordingly, the gate signals from the gate driving IC may be supplied to the gate line 52 via the gate pad electrode 80.

Although not shown, the data pad 94 may be connected to a data driving IC to supply data signals from the data driving IC to the data line 54. Accordingly, the data pad 94 may include a semiconductor pattern having the active layer 64 and the ohmic contact layer 66, and the data pad electrode 84 may extend from the data line 54, wherein the data pad electrode 84 may be formed to have a pattern similar to the semiconductor pattern, and a plurality of data contact holes passing 78 through the passivation film 68 to expose portions of the data pad electrode 84. Thus, although a portion of the data pad electrode 84 exposed through at least one or more gate contact holes 78 may be pulled out during repairing processes, the data pad electrode 84 exposed through a remaining data contact hole 78 may maintain electrical connection to the data TCP having the data driving IC mounted thereon. Accordingly, the data signals from the data driving IC may be supplied to the data line 54 via the data pad electrode 84.

Figure 9A:
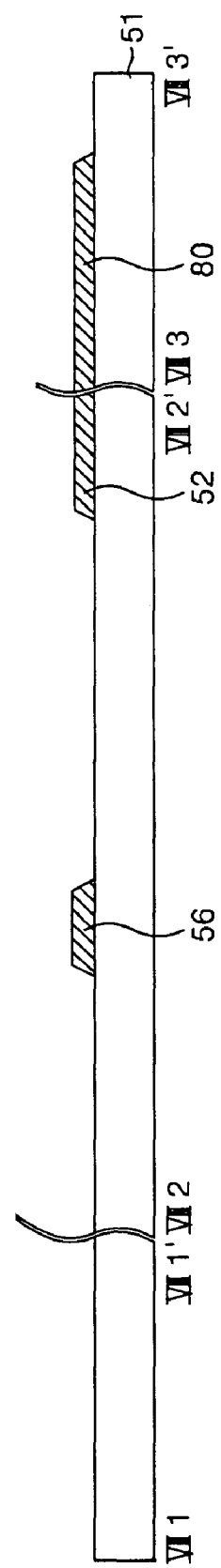

FIGS. 9A to 9D are cross sectional views along VI1-VI1', VI2-VI2', and VI3-VI3' of FIG. 8 of an exemplary method of fabricating the thin film transistor array substrate of FIG. 8 according to the present invention. In FIG. 9A, a gate metal layer made of an aluminum system metal may be deposited on an entire surface of the lower substrate 51 and patterned by photolithographic and etching processes to form a first conductive pattern group including the gate line 52, the gate electrode 56, and the gate pad electrode 80.

Figure 9B:
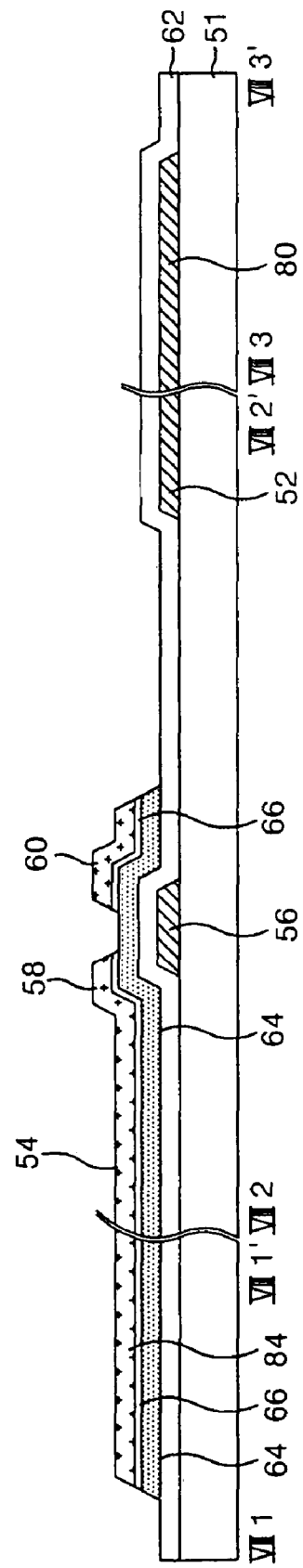

In FIG. 9B, the gate insulating film 62, the first and the second semiconductor layer, and the data metal layer may be sequentially formed on the lower substrate 51 with the first conductive pattern group. Then, although not shown, a photo-resist pattern may be formed on the data metal layer by photolithographic processes using a second mask, wherein the photo-resist pattern may have channel regions of different heights. Then, the data metal layer may be patterned by a wet etching process using the photo-resist pattern having the channel portions of different heights to form the second semiconductor conductive pattern group including the data line 54, the source electrode 58, the drain electrode 60, which may be integral to the source electrode 58, and the data pad electrode 84. Next, the first and the second semiconductor layers may be simultaneously patterned by an etching process using the photo-resist pattern having the channel portions of different heights to form the active layer 64 and the ohmic contact layer 66. Then, a photo-resist pattern having a relatively lower height in the channel region may be removed through an ashing process, and portions of the source electrode and the drain electrode within the channel region and the ohmic contact layer 66 may be etched through a dry etching technique. Accordingly, the active layer 64 in the channel region may be exposed to electrically separate the source electrode 58 from the drain electrode 60. Next, remaining portions of the photo-resist pattern on the second conductive pattern group may be removed by a strip process.

In FIG. 9C, a reflective metal layer made of an aluminum system metal may be deposited on the gate insulating film 62 provided with the second conductive pattern group. Then, the reflective metal layer may be patterned by photolithographic and etching processes to form a third conductive pattern group including the reflective electrode 72.

Figure 9D:
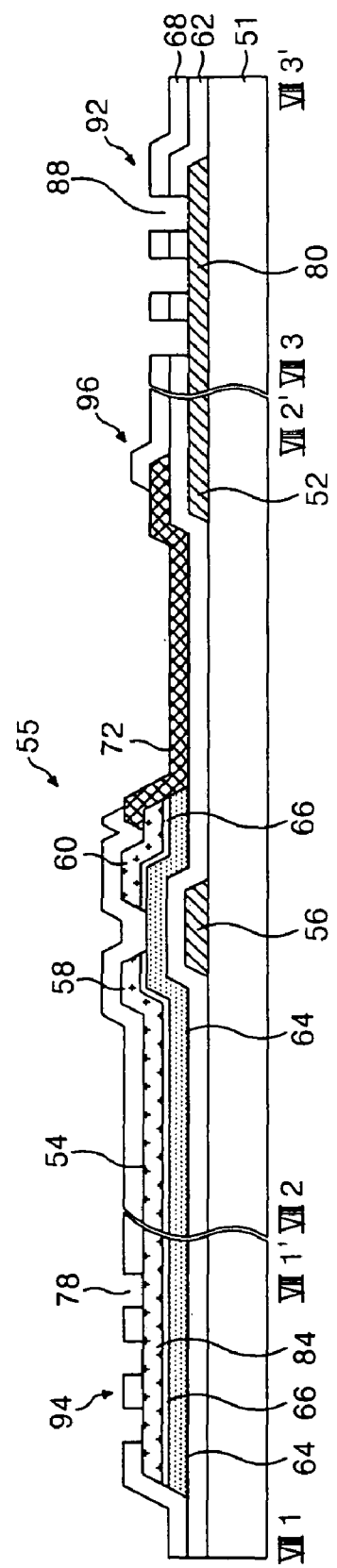

In FIG. 9D, one of an organic insulating material or an inorganic insulating material may be deposited on the gate insulating film 62 provided with the third conductive pattern group to form the passivation film 68 deposited entirely on the lower substrate 51. Then, the passivation film 68 may be patterned by photolithographic and etching processes to form the gate contact holes 88 and the data holes 78. The gate contact holes 88 may be formed to pass through the passivation film 68 and the gate insulating film 62 to expose regions of the gate pad electrode 80. Similarly, the data contact holes 78 may be formed to pass through the passivation film 68 to expose regions of the data pad electrode 84.

Figure 10:
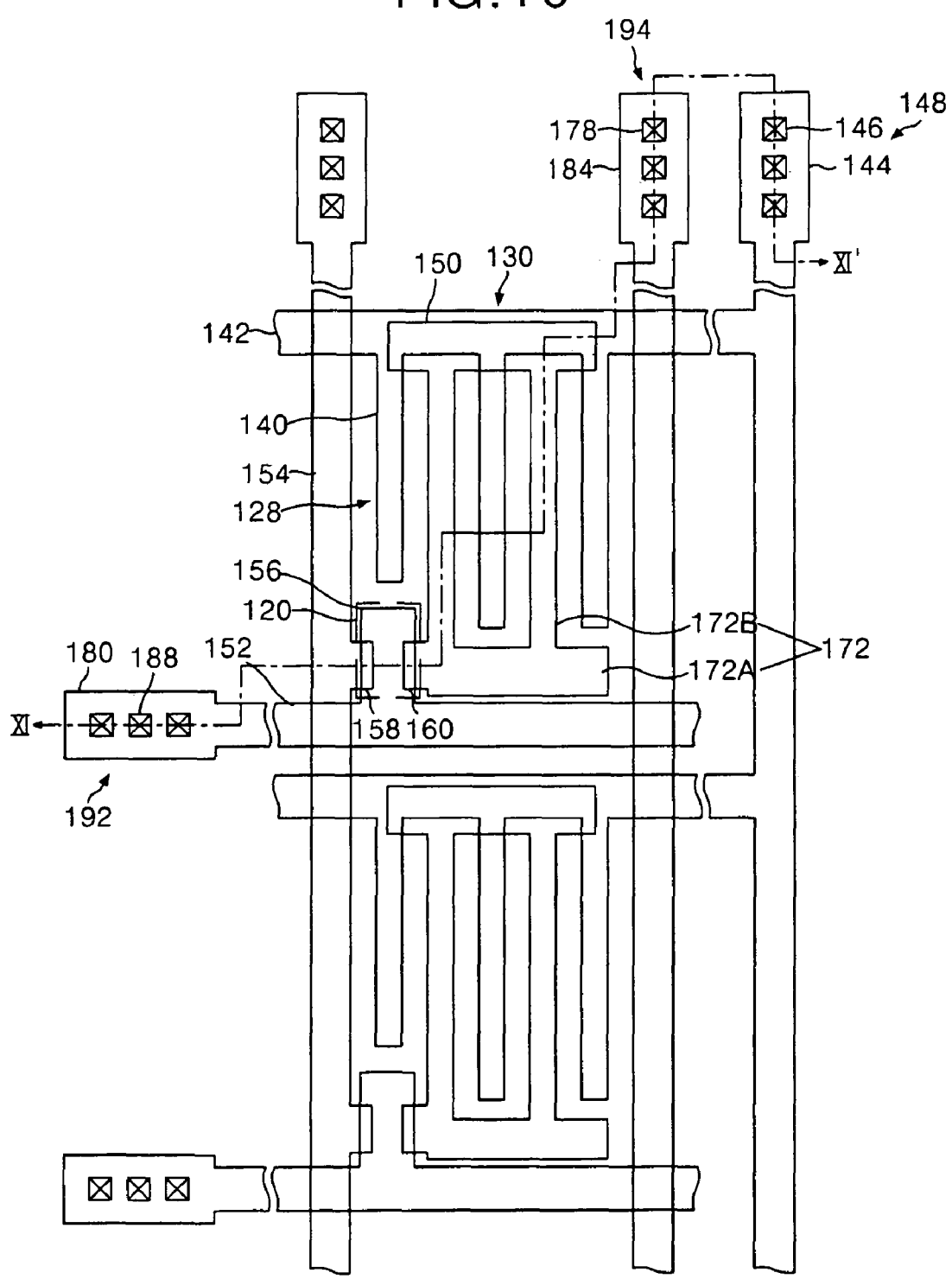
FIG. 10 is a plan view of another exemplary thin film transistor array substrate according to the present invention.
Figure 11:
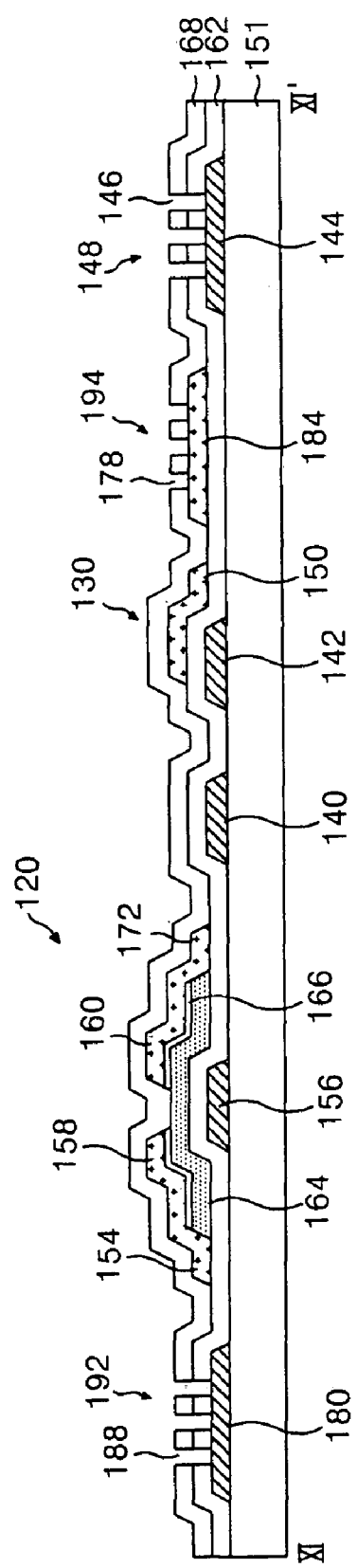
FIG. 11 is a cross sectional view along XI-XI' of FIG. 10 of the thin film transistor array substrate of FIG. 10 according to the present invention.

FIG. 10 is a plan view of another exemplary thin film transistor array substrate according to the present invention, and FIG. 11 is a cross sectional view along XI-XI' of FIG. 10 of the thin film transistor array substrate of FIG. 10 according to the present invention. In FIGS. 10 and 11, a thin film transistor array substrate of an In-Plane Switching (IPS)-type may include a gate line 152 and a data line 154 formed on a lower substrate 151 to intersect each other. In addition, a thin film transistor 120 may formed at each intersection of the gate and data lines 152 and 154, a pixel electrode 172 and a common electrode 140 may be formed to generate a horizontal electric field in a pixel region defined by the intersection of the gate and data lines 152 and 154, and a common line 142 may be connected to the common electrode 140. Moreover, the thin film transistor array substrate may include a storage capacitor 130 formed at an overlapped portion between the pixel electrode 172 and the common line 142, a gate pad 192 connected to the gate line 152, a data pad 194 connected to a data line 154, and a common pad 148 connected to the common line 142. Accordingly, the gate line 152 may supply gate signals to a gate electrode 156 of the thin film transistor 120, and the data line 154 may supply pixel signals to a pixel electrode 172 via a drain electrode 160 of the thin film transistor 120. In addition, the common line 142 may be formed in parallel with the gate line 152 with the pixel region 128 positioned between the common line 142 and the gate line 152 to supply a reference voltage for driving the liquid crystal to the common electrode 140.

The thin film transistor 120, in response to the gate signals transmitted along the gate line 152, may allow the pixel signal of the data line 154 to be charged and maintained in the pixel electrode 172. The thin film transistor 120 may include a gate electrode 156 connected to the gate line 152, a source electrode 158 connected to the data line 154, and a drain electrode 160 connected to the pixel electrode 172. In addition, the thin film transistor 120 may include an active layer 164 overlapping the gate electrode 156 with a gate insulating film 162 disposed therebetween and a channel between the source electrode 158 and the drain electrode 160. An ohmic contact layer 166 for making ohmic contact with the source electrode 158 and the drain electrode 160 may be formed on the active layer 164.

In FIG. 11, the pixel electrode 172 may be formed at the pixel region 128 to be integral with the drain electrode 160 of the thin film transistor 120 and may also be integral with the storage electrode 150. For example, the pixel electrode 172 may include a horizontal part 172A connected to the drain electrode 160 and formed in parallel with adjacent gate line 152, and a finger part 172B extending from the horizontal part 172A and formed in parallel with the common electrode 140. In addition, the common electrode 140 may be connected to the common line 142 and may be formed in the pixel region 128. Thus, the common electrode 140 may be formed in parallel with the finger part 172B of the pixel electrode 172 in the pixel region 128.

Accordingly, a horizontal electric field may be formed between the pixel electrode 14 to which the pixel signals are supplied via the thin film transistor 120 and the common electrode 140 to which the reference voltage is supplied via the common line 16. Moreover, the horizontal electric field may be formed between the finger part 172B of the pixel electrode 172 and the common electrode 140. Accordingly, the liquid crystal molecules arranged along the horizontal direction between the thin film transistor array substrate and the color filter array substrate by the horizontal electric field may rotate due to dielectric anisotropy. Thus, the light transmittance transmitting the pixel region 128 may differ in accordance with a rotation amount of the liquid crystal molecules, thereby producing images.

In FIG. 11, the storage capacitor 130 may include the common line 142, and a storage electrode 150 overlapping the common line 142 with the gate insulating film 162 disposed therebetween, wherein the storage electrode 150 may be formed integrally with the pixel electrode 172. The storage capacitor 130 may allow a pixel signal charged in the pixel electrode 172 to be stable maintained until a next pixel signal is charged.

Although not shown, the gate line 152 may be connected, via a gate pad 192, to a gate driving IC. In addition, the gate pad 192 may include a gate pad electrode 180 extending from the gate line 152, and a plurality of gate contact holes 188 passing through the gate insulating film 162 and the passivation film 168 to expose regions of the gate pad electrode 180.

Although not shown, the data line 154 may be connected, via a data pad 194, to the data driving IC. In addition, the data pad 194 may include a data pad electrode 184 extended from the data line 154, and a plurality of data contact holes 178 passing through the passivation film 52 to expose regions of the data pad electrode 184.

Although not shown, the common line 142 may be provided with a reference voltage from an external reference voltage source via the common pad 184. In addition, the common pad 184 may include a common pad electrode 144 extending from the common line 142, and a plurality of common contact holes 146 passing through the gate insulating film 162 and the passivation film 168 to expose regions of the common pad electrode 144.

Figure 12A:
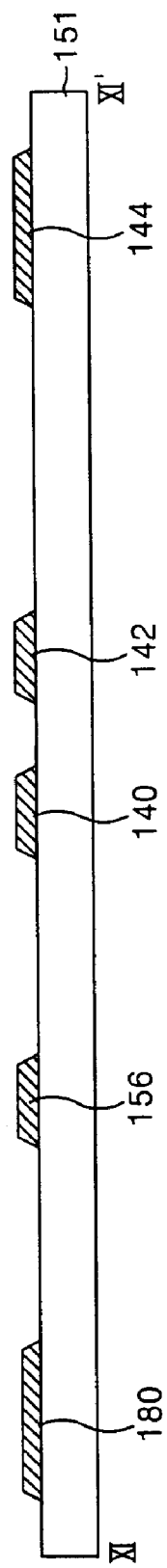
FIGS. 12A to 12D are cross sectional views along XI-Xi' of FIG. 10 of an exemplary method of fabricating the thin film transistor array substrate of FIG. 11 according to the present invention.

FIGS. 12A to 12D are cross sectional views along XI-XI' of FIG. 10 of an exemplary method of fabricating the thin film transistor array substrate of FIG. 11 according to the present invention. In FIG. 12A, a first conductive pattern group including the common line 142, the common electrode 140, the common pad electrode 144, the gate line (not shown), the gate electrode 156, and the gate pad electrode 180 may be formed on the lower substrate 151. For example, a gate metal layer, such as an aluminum system metal, may be formed on the lower substrate 151 by a deposition technique, such as sputtering. Then, the gate metal layer may be patterned by photolithographic and etching processes to form the first conductive pattern group including the common line 142, the common electrode 140, the common pad electrode 144, the gate line (not shown), the gate electrode 156, and the gate pad electrode 180.

Figure 12B:
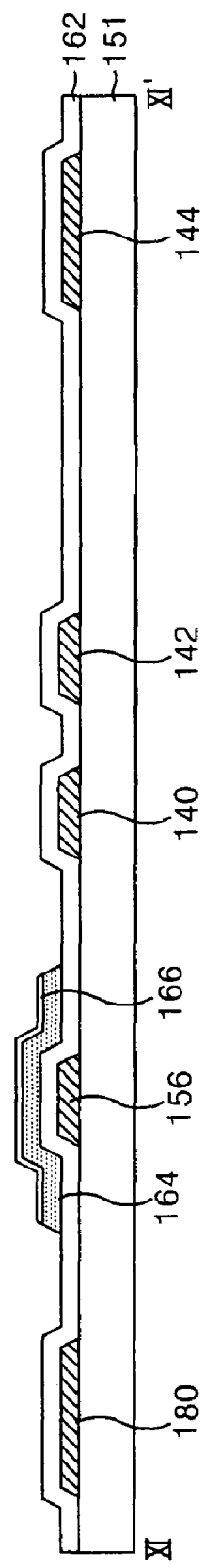

In FIG. 12B, a semiconductor pattern including the gate insulating film 162, and the active layer 164 and the ohmic contact layer 166 on the gate insulating film 162 may be formed on the lower substrate 151 having the first conductive pattern group. For example, the gate insulating film 162 and a first semiconductor layer and a second semiconductor layer may be sequentially formed on the lower substrate 151 by a deposition method, such as PECVD and sputtering. The gate insulating film 162 may be made of an inorganic insulating material, such as a silicon oxide ($SiO_x$) or a silicon nitride ($SiN_x$). The first semiconductor layer may be made of an undoped amorphous silicon, and the second conductor layer may be made of an amorphous silicon doped with an impurity of a N-type or P-type. Then, the first and the second semiconductor layers may be simultaneously patterned by photolithographic and etching processes to form a semiconductor pattern having the active layer 164 and the ohmic contact layer 166.

Figure 12C:
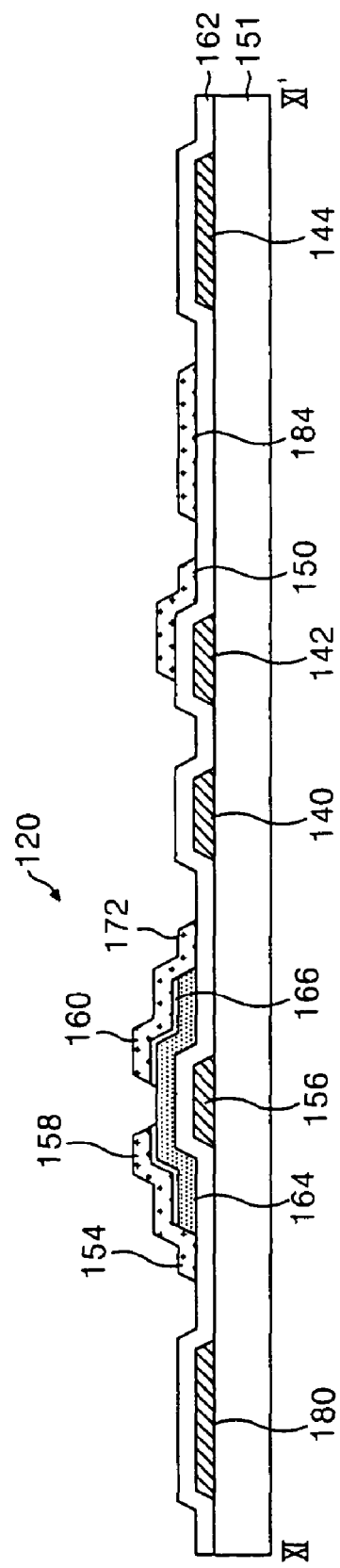

In FIG. 12C, a second conductive pattern group including the source electrode 158, the drain electrode 160, the pixel electrode 172, the data line 154, and the data pad electrode 184 may be formed on the lower substrate 151 having the semiconductor pattern. For example, the data metal layer may be deposited on the lower substrate 151 having the semiconductor pattern formed thereon. Then, the data metal layer may be patterned by photolithographic and etching processes to provide the second conductive pattern group including the data line 154, the source electrode 158, the drain electrode 160, which may be integral to the drain electrode 160, and the data pad electrode 184. Next, the ohmic contact layer 166 may be etched by a dry etching process using the source electrode 158 and the drain electrode 160 as a mask, thereby exposing the active layer 164 of the thin film transistor.

Figure 12D:
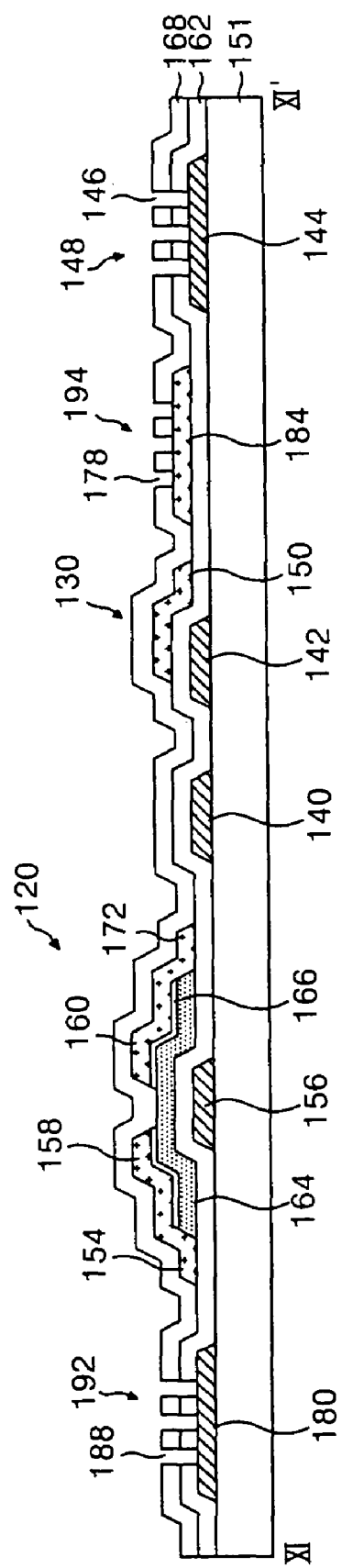

In FIG. 12D, a passivation film 168 including a plurality of common contact holes 146, gate contact holes 188, and data contact holes 178 may be formed on the gate insulating film 162 having the second conductive pattern group formed thereon. For example, the passivation film 168 may be formed on an entire surface of the gate insulating film 162 by a deposition method, such as PECVD. Then, the passivation film 168 may be patterned by photolithographic and etching processes to form the common contact holes 146, the gate contact holes 188, and the data contact holes 178. The common contact holes 146 may be formed to pass through the passivation film 168 and the gate insulating film 162 to expose regions of the common pad electrode 144. Similarly, the gate contact holes 188 may be formed to pass through the passivation film 168 and the gate insulating film 162 to expose regions of the gate pad electrode 180. Moreover, the data contact holes 178 may be formed to pass through the passivation film 168 to expose regions of the data pad electrode 180. The passivation film 168 may be made of an inorganic insulating material such as the gate insulating film 162, or may be formed of an organic insulating material having a low dielectric constant, such as an acryl system organic compound, benzocyclobutene (BCB), or perfluorocyclobutane (PFCB).

Figure 13:
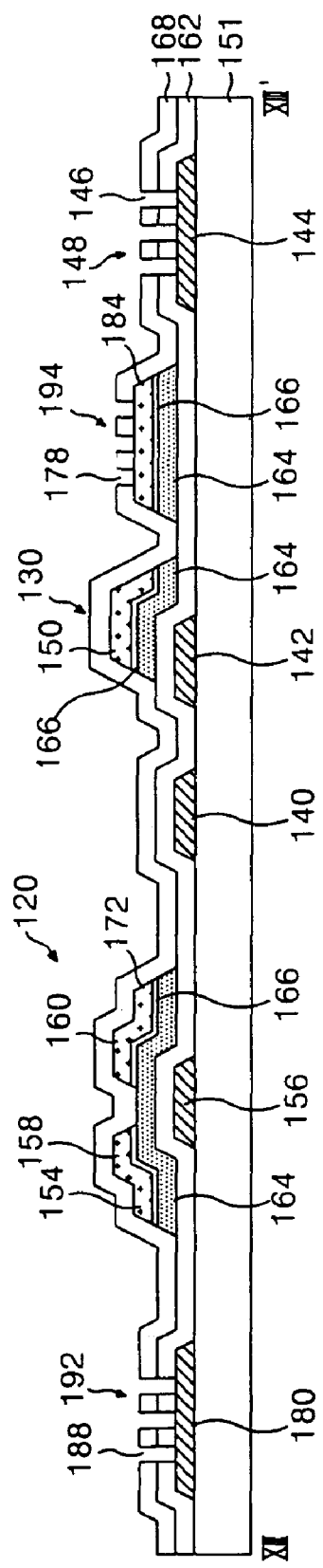
FIG. 13 is a cross sectional view along XII-XII' corresponding to XI-XI' of FIG. 10 according to another exemplary thin film transistor array substrate according to the present invention.

FIG. 13 is a cross sectional view along XII-XII' corresponding to XI-XI' of FIG. 10 according to another exemplary thin film transistor array substrate according to the present invention. In FIG. 13, a thin film transistor array substrate may be similar to that of the thin film transistor array substrate of FIGS. 10 and 11, except that the active layer and the ohmic contact layer may be formed below the second conductive pattern group including the source electrode, the drain electrode, the data pad electrode, and the data line along the second conductive pattern group. Accordingly, certain features of the exemplary thin film transistor array substrate of FIG. 13 have been omitted for the sake of brevity.

In FIG. 13, a thin film transistor array substrate may include the source electrode 158, the drain electrode 160, and the data pad electrode 184 formed to have a pattern similar to the semiconductor pattern. In addition, the storage capacitor 130 may include a common line 142, a storage electrode 150, which may overlap the common line 142 with the gate insulating film 162 therebetween and may be integral with a pixel electrode 172, and semiconductor patterns 164 and 166 having a pattern similar to a pattern of the storage electrode 150. Accordingly, the storage capacitor 130 may stably maintain a pixel signal charged in the pixel electrode 172 until a next pixel signal is charged.

Although not shown, the gate pad 192 may be connected to a gate driving IC to supply gate signals from the gate driving IC to a gate line 152. The gate pad 192 may include a gate pad electrode 180 extending from the gate line 152 and a plurality of gate contact holes 188 passing through the gate insulating film 162 and a passivation film 168 to expose portions of the gate pad electrode 180. Thus, although a portion of the gate pad electrode 180 exposed through at least one or more gate contact holes 188 may be pulled out during repairing processes, the gate pad electrode 180 exposed through a remaining gate contact hole 188 may maintain electrical connection to the gate TCP having the gate driving IC mounted thereon. Accordingly, the gate signals from the gate driving IC may be supplied to the gate line via the gate pad electrode 180.

Although not shown, the data pad 194 may be connected to a data driving IC to supply data signals from the data driving IC to the data line 154. The data pad 194 may include a semiconductor pattern having an active layer 164 and an ohmic contact layer 166, a data pad electrode 184 having a pattern similar to a pattern of the semiconductor pattern and extending from the data line 154, and a plurality of data contact holes 178 passing through the passivation film 168 to expose portions of the data pad electrode 184. Thus, although a portion of the data pad electrode 184 exposed through at least one or more data contact holes 178 may be pulled out during repairing processes, the data pad electrode 184 exposed through a remaining data contact hole 178 may maintain electrical connection to the data TCP having the data driving IC mounted thereon. Accordingly, the data signals from the data driving IC may be supplied to the data line 154 via the data pad electrode 184.

Although not shown, a common pad 148 may be connected to an external reference voltage source to supply a reference voltage to a common line. The common pad 148 may include a common pad electrode 144 extending from the common line 143, and a plurality of common contact holes 146 passing through the gate insulating film 162 and the passivation film 168 to expose portions of the common pad electrode 144. Thus, although a portion of the common pad electrode 144 exposed through at least one or more common contact holes 146 may be pulled out during repairing processes, the common pad electrode 144 exposed through a remaining common contact hole 146 may maintain electrical connection to an externally connected TCP. Accordingly, the reference voltage from the external reference voltage source may be supplied to the common line 142 via the data pad electrode 144.

Figure 14A:
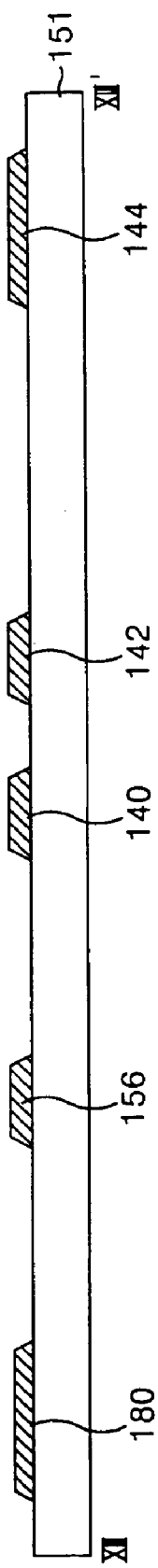
FIGS. 14A to 14C are cross sectional views along XII-XII' corresponding to XI-XI' of FIG. 10 according to another exemplary method of fabricating the thin film transistor array substrate of FIG. 13 according to the present invention.
Figure 14B:
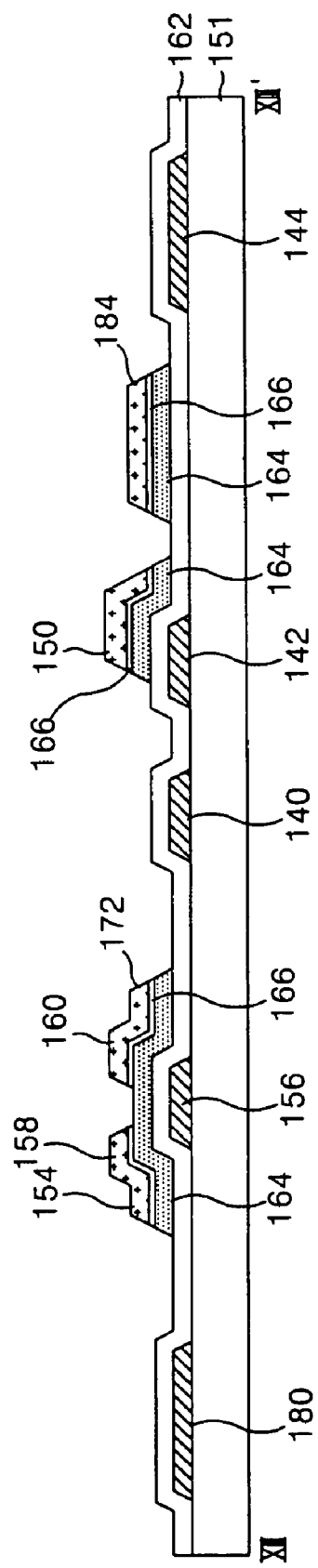
Figure 14C:
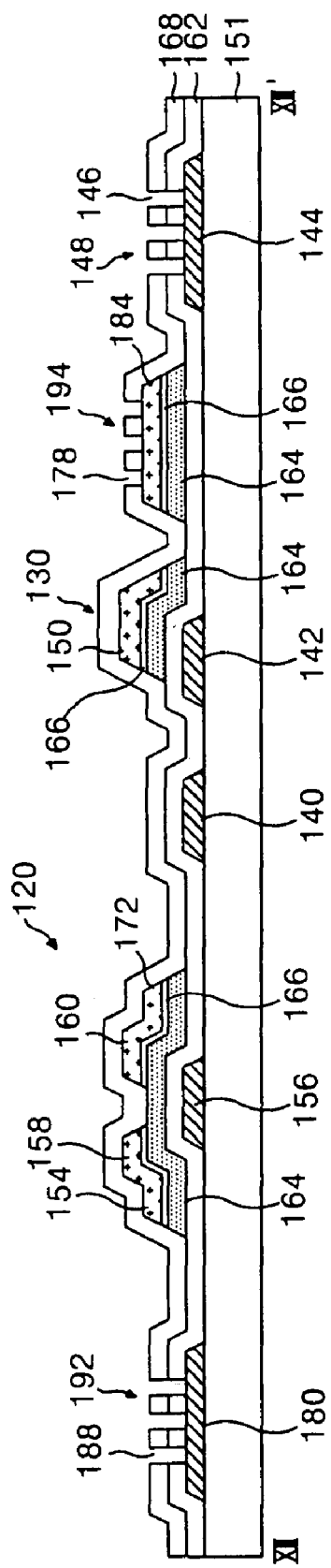

FIGS. 14A to 14C are cross sectional views along XII-XII' corresponding to XI-XI' of FIG. 10 according to another exemplary method of fabricating the thin film transistor array substrate of FIG. 13 according to the present invention. Although not shown, a gate metal layer made of an aluminum system metal may be deposited on an entire surface of the lower substrate 151 and then patterned by photolithographic and etching processes to form a first conductive pattern group including the common line 142, the common electrode 144, the gate line 140, the gate electrode 156, and the gate pad electrode 180, as shown in FIG. 14A.

In FIG. 14B, the gate insulating film 162, the first and the second semiconductor layers, and the data metal layer may be sequentially formed on the lower substrate 151 having the first conductive pattern group. Then, although not shown, a photo-resist pattern may be formed on the data metal layer by a photolithographic process using a second mask, wherein the photo-resist pattern may have channel regions of different heights. Then, the data metal layer may be patterned by a wet etching process using the photo-resist pattern having the channel regions of different heights to form the data pattern including the data line 154, the source electrode 158, the drain electrode 160, the data pad electrode 184, and the storage electrode 150. Then, the first and the second semiconductor layers may be simultaneously patterned by a dry etching process using the photo-resist pattern having the channel regions of different heights to form the active layer 164 and the ohmic contact layer 166. Next, a photo-resist pattern having a relatively lower height in the channel region may be removed through an ashing process. Then, a connecting portion of the source electrode and the drain electrode in the channel region and the ohmic contact layer 166 may be etched through a dry etching process. As a result, the active layer 164 in the channel region may be exposed to electrically separate the source electrode 158 from the drain electrode 160. Then, remaining portions of photo-resist pattern left on the second conductive pattern group may be removed by a stripping process.

In FIG. 14C, one of an organic insulating material or an inorganic insulating material may be deposited on the entire surface of the gate insulating film 162 provided with the second conductive pattern group to form the passivation film 168 deposited entirely on the gate insulating film 162. Then, the passivation film 168 may be patterned by photolithographic and etching processes to form the common contact holes, the gate contact holes 188, and the data holes 178. Accordingly, the common contact holes 146 may be formed to pass through the passivation film 168 and the gate insulating film 162 to expose regions of the common pad electrode 144. Similarly, the gate contact holes 188 may be formed to pass through the passivation film 168 and the gate insulating film 162 to expose regions of the gate pad electrode 180. Moreover, the data contact holes 178 may be formed to pass through the passivation film 168 to expose regions of the data pad electrode 184.

Figure 15:
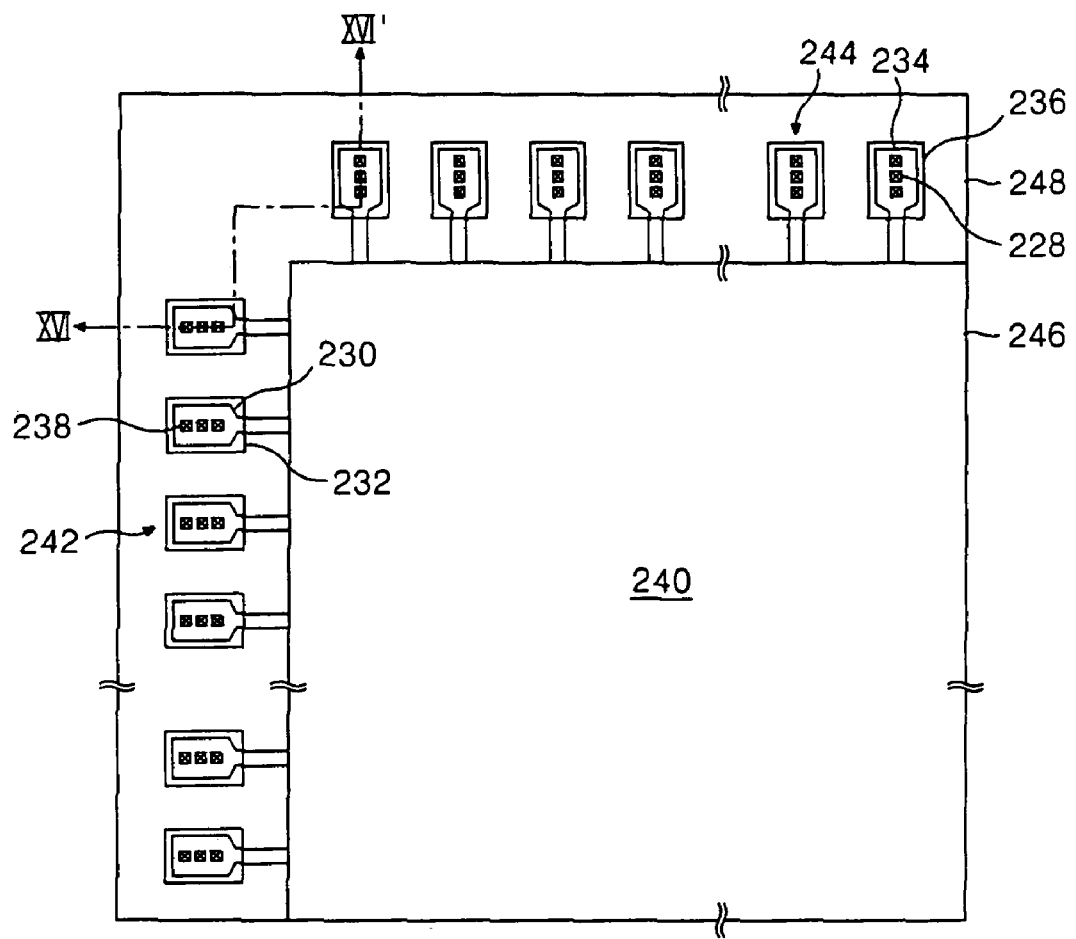
FIG. 15 is a plan view of another exemplary thin film transistor array substrate according to the present invention.
Figure 16:
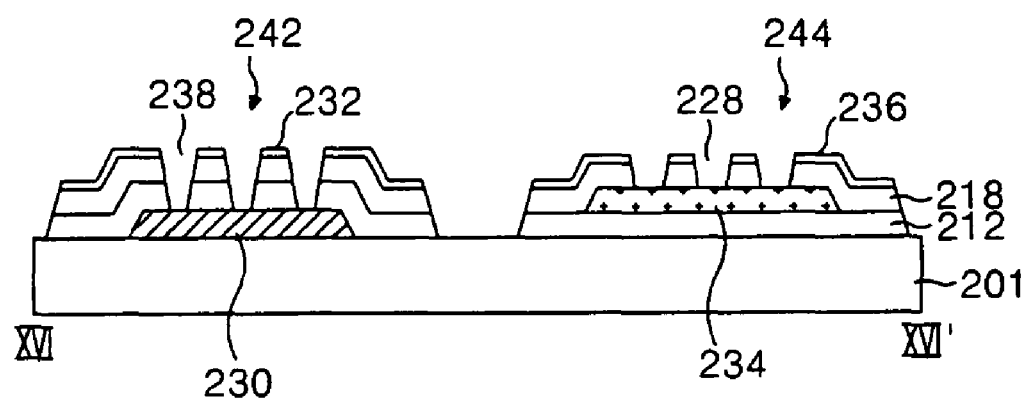
FIG. 16 is a cross sectional view along XVI-XVI' of FIG. 15 of the thin film transistor array substrate according to the present invention.

FIG. 15 is a plan view of another exemplary thin film transistor array substrate according to the present invention, and FIG. 16 is a cross sectional view along XVI-XVI' of FIG.

15 of the thin film transistor array substrate according to the present invention. In FIGS. 15 and 16, a thin film transistor array substrate may include an image display section 240, and a gate pad 242 and a data pad 244 connected between driving ICs (not shown) and the image display section 240. The image display section 240 may include a thin film transistor array substrate 248 and a color array substrate 246 attached to each other and having liquid cells arranged therebetween.

The gate pad 242 may supply gate signals from the gate driving IC (not shown) to each gate line. The gate pad 242 may include a gate pad lower electrode 230 extending from the gate line, a plurality of gate contact holes 238 passing through the gate insulating film 212 and a passivation film 218 to expose regions of the gate pad lower electrode 230, and a gate pad upper electrode 232 having a pattern similar to a pattern of the gate insulating film 238 and the passivation film 218.

The data pad 244 may supply data signals from the data driving IC to the data line. The data pad 244 may include a data pad lower electrode 234 extending from the data line, a plurality of data contact holes 228 passing through the passivation film 218 to expose regions of the data pad lower electrode 234, and a data pad upper electrode 236 having a pattern similar to a pattern of the passivation film 218.

Figure 17A:
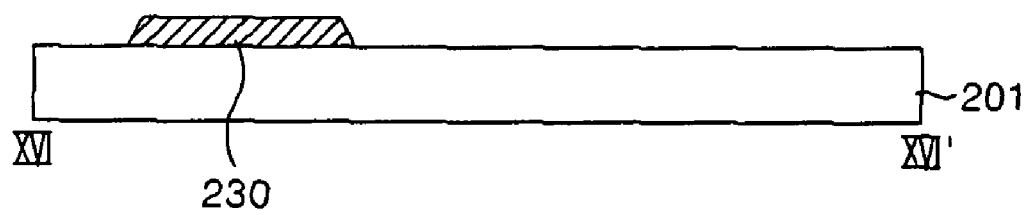
FIGS. 17A to 17D are cross sectional views along XVI-XVI' in FIG. 16 of an exemplary method of fabricating the thin film transistor array substrate of FIG. 16 according to the present invention.

FIGS. 17A to 17D are cross sectional views along XVI-XVI' in FIG. 16 of an exemplary method of fabricating the thin film transistor array substrate of FIG. 16 according to the present invention. Although not shown, a gate metal layer may be deposited on an entire surface of the lower substrate 201 and then patterned by photolithographic and etching processes to form the gate electrode and the gate line of the thin film transistor along with the gate pad lower electrode 230, as shown in FIG. 17A.

Figure 17B:
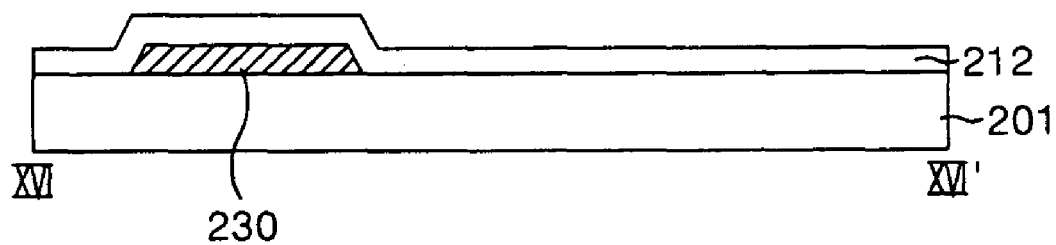

In FIG. 17B, one of an organic insulating material or an inorganic insulating material may be deposited on the entire surface of the lower substrate 201 having the gate pad lower electrode 230 formed thereon to form the gate insulating film 212. Then, although not shown, the semiconductor pattern, which includes the active layer and the ohmic contact layer that form a channel portion of the thin film transistor, may be formed on the lower substrate 212 having the gate insulating film 212 formed thereon.

Figure 17C:
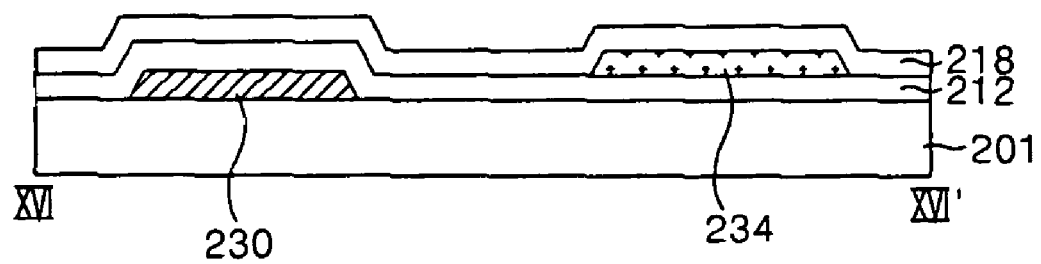

In FIG. 17C, a data metal layer may be entirely deposited on the lower substrate 201 having the semiconductor pattern thereon and then patterned to form the data line, and the source and the drain electrodes of the thin film transistor along with the data pad lower electrode 234.

Figure 17D:
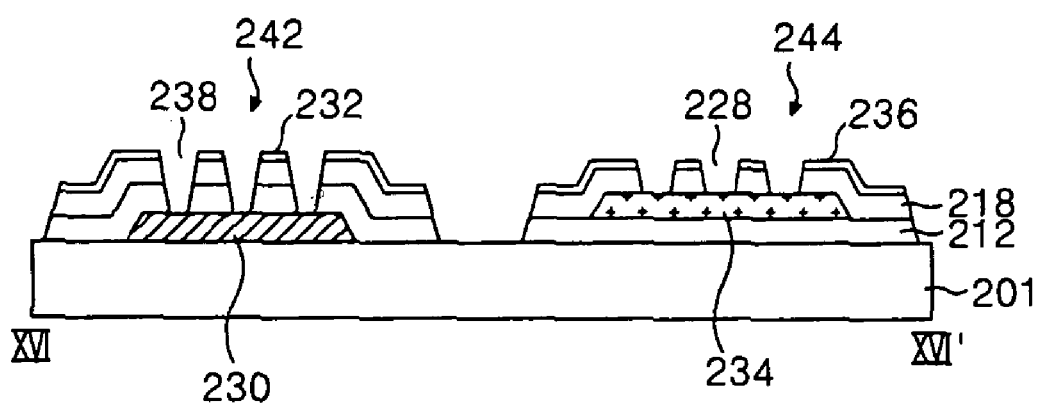

In FIG. 17D, one of an organic insulating material or an inorganic insulating material may be entirely deposited on the lower substrate 201 having the data pad lower electrode 234 thereon to form the passivation film 218. Then, a transparent conductive material may be entirely deposited on the passivation film 218 and then patterned to form the gate pad upper electrode 232 and the data pad upper electrode 236. Next, the gate insulating film 212 and the passivation film 218 may be dry-etched by using the gate pad upper electrode 232 and the data pad upper electrode 236 as a mask to form a plurality of gate contact holes 238 and data contact holes 228.

Figure 18A:
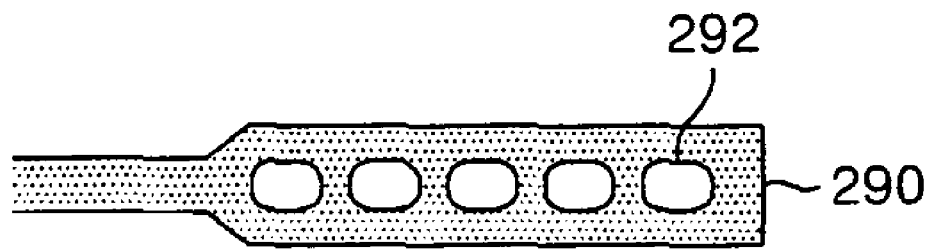
FIGS. 18A to 18F are plan views of exemplary contact holes according to the present invention.
Figure 18B:
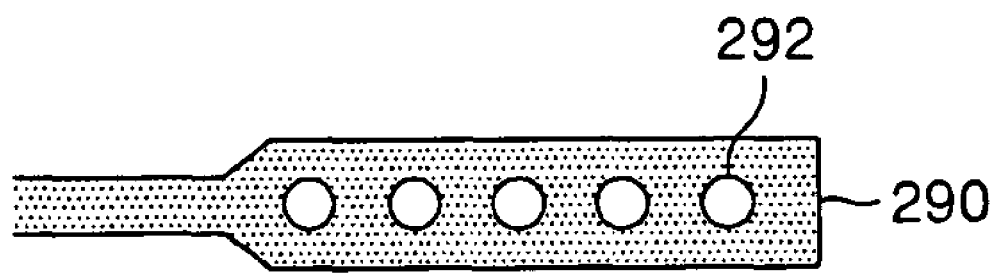
Figure 18C:
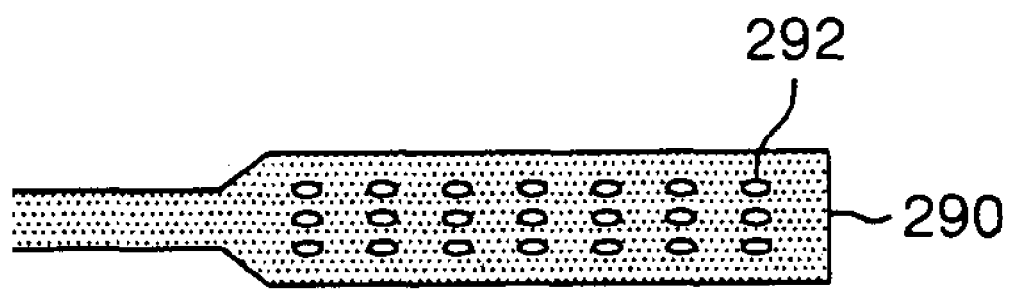
Figure 18D:
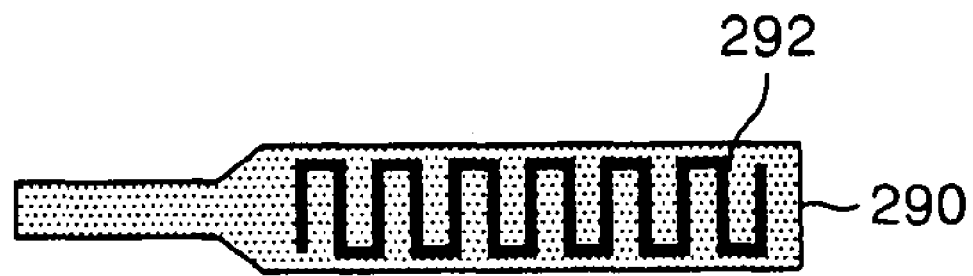
Figure 18E:
Figure 18F:
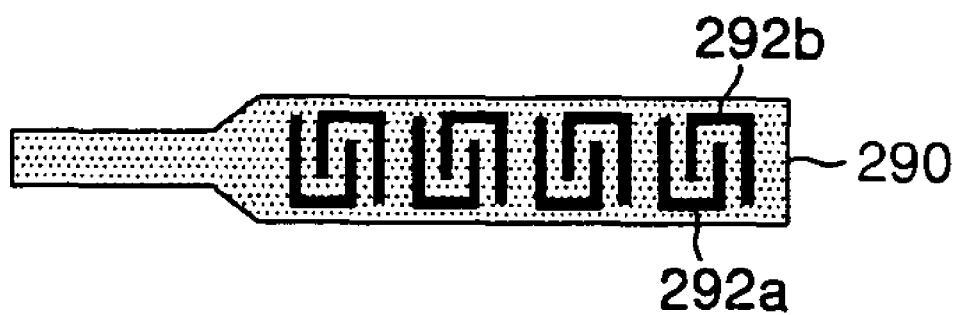

FIGS. 18A to 18F are plan views of exemplary contact holes according to the present invention. In FIG. 18A, contact holes 292 covering the gate contact holes, the data contact holes, and the common contact holes may have a polygon shape to thereby expose the regions of the pad electrode 290 such as the common, the gate and the data pad electrodes. In FIG. 18B, contact holes 292 covering the gate contact holes, the data contact holes, and the common contact holes may have a circular shape having a relatively wide diameter to thereby expose the regions of the pad electrode 290 such as the common, the gate and the data pad electrodes. Conversely, in FIG. 18C, contact holes 292 covering the gate contact holes, the data contact holes, and the common contact holes may have a circular shape having a relatively narrow diameter to thereby expose the regions of the pad electrode 290 such as the common, the gate and the data pad electrodes. Alternatively, as shown in FIG. 18D, a contact hole 292 may have a crooked or zigzag configuration to expose the pad electrode. Furthermore, as shown in FIG. 18E, the contact hole 292 may have a shape including a first C-shaped contact hole 292a and a second C-shaped contact hole 292b engaged with each other along a lengthwise direction of the pad electrode 290. Furthermore, as shown in FIG. 18F, the contact hole 292 may have a shape including a first U-shaped contact hole 292a and a second U-shaped contact hole 292b engaged with each other along a widthwise direction of the pad electrode 290. For example, the contact holes 292 shown in FIGS. 18A to 18F may have a width of about 5 μm to about 50 μm.

Figure 19A:
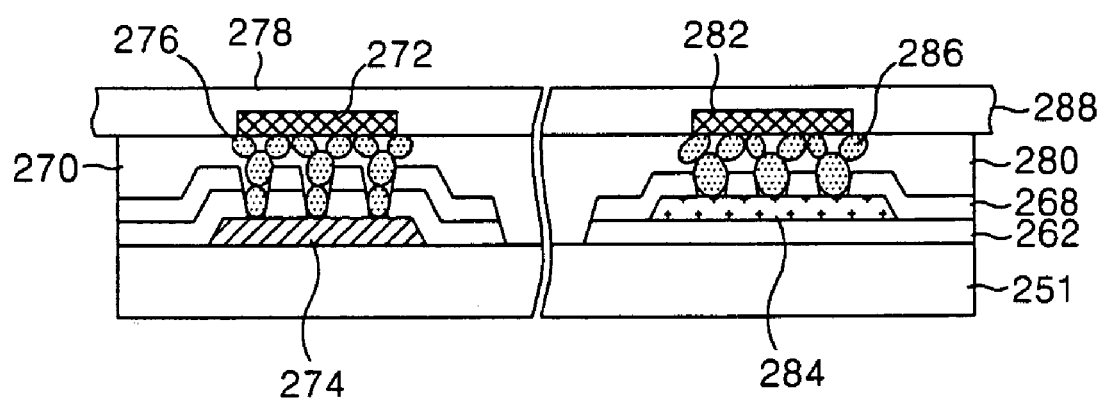
FIGS. 19A and 19B are schematic cross sectional views of exemplary TCPs connected to a pad lower electrode of a thin film array substrate according to the present invention.
Figure 19B:
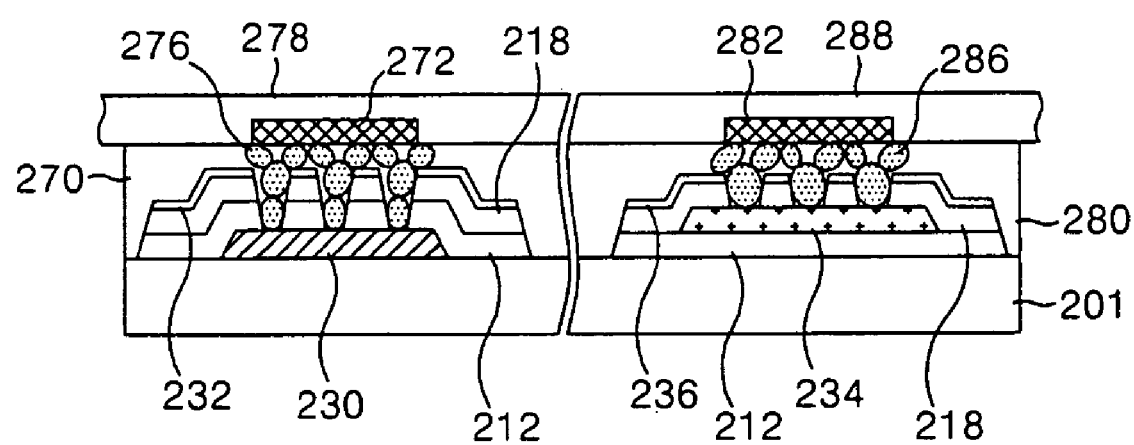

FIGS. 19A and 19B are schematic cross sectional views of exemplary TCPs connected to a pad lower electrode of a thin film array substrate according to the present invention. In FIGS. 19A and 19B, a pad electrode may be implemented for any or all of the thin film array substrates of FIGS. 5-17. As shown in FIGS. 19A and 19B, pad electrodes may be contacted via anisotropy conductive films (ACFs) 270 and 280, with the TCPs 278 and 288 having the driving IC mounted thereon. Accordingly, output pads 272 and 282 formed on the TCPs 278 and 288 may be electrically connected, via conductive balls 276 and 286 of ACFs 270 and 280, to at least one of the gate pad electrodes 274 and 230, the data pad electrodes 284 and 234, and the common pad electrodes (not shown). For example, first output pads 272 on a base film of the TCP 278 may be electrically connected to the gate pad electrodes 274 and 230, via the conductive balls 276 and 286 of ACFs 270 and 280. Similarly, second output pads 282 on a base film of the TCP 288 may be electrically connected to the data pad electrodes 284 and 234. Moreover, although not shown, third output pads on a base film of the TCP 288 may be electrically connected to the common pad electrodes via the conductive balls 276 and 286 of ACFs 270 and 280.

Accordingly, any one of the gate pad, the data pad, and the common pad may have a structure similar to that of any one of the gate pad electrodes 274 and 230, the data pad electrodes 284 and 234, and the common pad electrodes exposed through the plurality of the contact holes, thereby preventing the disconnection of the pad lower electrode although the attachment of the TCPs 278 and 288 may be repeatedly performed.

According to the present invention, a pad electrode including a gate pad electrode, a data pad electrode, and a common pad electrode may be exposed through a plurality of contact holes. Thus, although a portion of the pad electrode may be pulled out during iterated repairing processes, the pad electrode exposed through a remaining contact hole may maintain electrical connection to the TCP. Accordingly, it may be possible to prevent the pad electrode from being electrically disconnected and to perform the TAB repairing process to easily attach and detach the TCP.

It will be apparent to those skilled in the art that various modifications and variations can be made in the liquid crystal display device and a method of fabricating a liquid crystal display device of the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
   a plurality of signal lines including a date line, a gate line and a common line on a substrate;
   a pixel electrode formed at an intersection area of the data line and the gate line;
   a plurality of pad electrodes including a gate pad electrode, a data pad electrode and a common pad electrode on the substrate, each one of the plurality of pad electrodes connected to one of the plurality of signal lines;
   two insulating films on the gate pad electrode and the common pad electrode, the two insulating films having a plurality of contact holes to expose a plurality of portions of each of the gate pad electrode and the common pad electrode; and
   anisotropic conductive film of which a plurality of conductive particles are directly connected to each of the gate pad electrode and the common pad electrode through the contact holes without any intermediate layer there-between covering the contact holes and the gate and common pad electrodes,
   wherein the pixel electrode and a common electrode is formed to generate a horizontal electric field in a pixel region defined by the intersection of the gate and data lines,
   wherein each of the plurality of the contact holes has a depth larger than diameter of the conductive particles of the anisotropic conductive film,
   wherein the data pad electrode include a semiconductor pattern having an active layer and an ohmic contact layer,
   wherein each of the plurality of contact holes has a first U-shaped contact hole and a second U-shaped contact hole engaged with the first U-shaped contact hole along a widthwise direction of the pad electrodes.

2. The device according to claim 1, wherein the plurality of signal lines include:
   the data line to which data signals are supplied via any one of the pad electrodes;
   the gate line to which gate signals are supplied via any one of the pad electrodes; and
   the common line to which a reference voltage signal is applied via any one of the pad electrodes.

3. The device according to claim 2, further comprising:
   the common electrode formed in parallel to the pixel electrode at the intersection area,
   wherein the pixel electrode receives the data signals and the common electrode receives the reference voltage signal to form the horizontal electric field parallel to the substrate.

4. The device according to claim 2, further comprising:
   a transparent conductive film having a pattern similar to a pattern of the two insulating films.

5. The device according to claim 1, wherein each of the plurality of contact holes has a width of about 5 μm to about 50 μm.

6. A method of fabricating a liquid crystal display device, comprising:
   forming a plurality of pad electrodes connected to a plurality of signal lines on a substrate;
   forming two insulating films having a plurality of contact holes to expose a plurality of portions of each of the plurality of pad electrodes; and
   connecting directly each of the exposed portions of the pad electrodes to a plurality of conductive particles of an anisotropic conductive film without any intermediate layer therebetween covering the contact holes and pad electrodes,
   wherein each of the plurality of the contact holes has a depth larger than diameter of the conductive particles of the anisotropic conductive film,
   wherein the data pad electrode include a semiconductor pattern having an active layer and an ohmic contact layer,
   wherein each of the plurality of contact holes has a first U-shaped contact hole and a second U-shaped contact hole engaged with the first U-shaped contact hole along a widthwise direction of the pad electrodes.

7. The method according to claim 6, further comprising:
   forming a data line to which data signals are supplied via any one of the pad electrodes; and
   forming a gate line to which gate signals are supplied via any one of the pad electrodes.

8. The method according to claim 7, further comprising:
   forming a pixel electrode at an intersection area of the data line and the gate line;
   forming a transparent conductive film having a pattern similar to a pattern of the two insulating films.

9. The method according to claim 6, further comprising:
   forming a common line to which a reference voltage signal is applied via any one of the pad electrodes and a common electrode connected to the common line; and
   forming a pixel electrode receiving the data signals,
   wherein the common electrode and the pixel electrode form a horizontal electric field parallel to the substrate.

10. The method according to claim 6, wherein each of the plurality of contact holes have a width of about 5 μm to about 50 μm.

* * * * *